(12) United States Patent
Maurino

(10) Patent No.: US 12,073,269 B2
(45) Date of Patent: Aug. 27, 2024

(54) SWITCHED-CAPACITOR INTEGRATORS WITH IMPROVED FLICKER NOISE REJECTION

(71) Applicant: Analog Devices International Unlimited Company, Limerick (IE)

(72) Inventor: Roberto S. Maurino, Turin (IT)

(73) Assignee: Analog Devices International Unlimited Company, Limerick (IE)

( * ) Notice: Subject to any disclaimer, the term of this patent is extended or adjusted under 35 U.S.C. 154(b) by 809 days.

(21) Appl. No.: 17/160,718

(22) Filed: Jan. 28, 2021

(65) Prior Publication Data

US 2022/0239308 A1    Jul. 28, 2022

(51) Int. Cl.
| G06G 7/186 | (2006.01) |
| H03H 19/00 | (2006.01) |
| H03M 1/44 | (2006.01) |
| H03M 3/00 | (2006.01) |

(52) U.S. Cl.
CPC ........... *G06G 7/1865* (2013.01); *G06G 7/186* (2013.01); *H03H 19/004* (2013.01); *H03M 1/442* (2013.01); *H03M 3/34* (2013.01); *H03M 3/458* (2013.01)

(58) Field of Classification Search
CPC ..... G06G 7/186; G06G 7/1865; H03M 1/442; H03M 3/34; H03M 3/458; H03M 3/342; H03M 3/376; H03H 19/004
See application file for complete search history.

(56) References Cited

U.S. PATENT DOCUMENTS

| 4,502,019 | A | 2/1985 | Van Roermund |
| 5,477,481 | A | 12/1995 | Kerth |
| 6,259,313 | B1 * | 7/2001 | Lewicki ................. H03F 3/345 330/252 |
| 6,954,169 | B1 | 10/2005 | Min |
| 7,009,549 | B1 | 3/2006 | Corsi |
| 7,038,532 | B1 * | 5/2006 | Bocko .................... G06G 7/186 327/554 |
| 7,719,452 | B2 | 5/2010 | Bardsley et al. |
| 10,483,995 | B1 | 11/2019 | Lok et al. |
| 2016/0048707 | A1 * | 2/2016 | Alladi .................... G06G 7/186 327/337 |

OTHER PUBLICATIONS

H. Chae in "Double-sampling highpass delta-sigma modulator with inherent frequency translation" in IEICE 2017. https://www.jstage.jst.go.jp/article/elex/14/20/14_14.20170862/_pdf (Year: 2017).*

(Continued)

*Primary Examiner* — Andrew Caldwell
*Assistant Examiner* — Carlo Waje
(74) *Attorney, Agent, or Firm* — Schwegman Lundberg & Woessner, P.A.

(57) ABSTRACT

An example SC integrator can include first and second sampling capacitors, an amplifier, an integrating capacitor, coupled at least to an output of the amplifier, and a switching arrangement. The SC integrator can be configured for adding (i.e., integrating in the integrating capacitor) sign-inverted samples of a flicker noise of the amplifier at one or more cycles of a master clock and can be configured for keeping the time distance/delay between those samples relatively small across a range of master clock frequencies.

20 Claims, 10 Drawing Sheets

(56) References Cited

OTHER PUBLICATIONS

J. Shiah and S. Mirabbasi, "A 5-V 290-μW Low-Noise Chopper-Stabilized Capacitive-Sensor Readout Circuit in 0.8-μm CMOS Using a Correlated-Level-Shifting Technique," in IEEE Transactions on Circuits and Systems II: Express Briefs, vol. 61, No. 4, pp. 254-258, Apr. 2014, doi: 10.1109/TCSII (Year: 2014).*

Z. Ignjatovic and M. F. Bocko, "A fully-differential switched capacitor chopper stabilized high-pass filter (mirrored integrator)," 2004 IEEE International Symposium on Circuits and Systems (IEEE Cat. No. 04CH37512), Vancouver, BC, Canada, 2004, pp. I-857, doi: 10.1109/ISCAS.2004.1328330. (Year: 2004).*

*Introduction to Switched-Capacitor Circuits*, Sections 14.1 & 14.2, 18 pages.

Ivanisevic et al., *Area-Efficient Switched-Capacitor Integrator with Flicker Noise Cancellation*, 2018 IEEE International Symposium on Circuits and Systems (ISCAS), 4 pages.

Liu et al., *A Low-Noise Chopper Amplifier with Offset and Low-Frequency Noise Compensation DC Servo Loop*, Electronics 2020, 9, 1797, www.mdpi.com/journal/electronics, 12 pages.

Berglund et al., *On the Realization of Switched-Capacitor Integrators for Sigma-Delta Modulators*, Dec. 21, 2017, 118 pages.

Brewer et al., *A 100dB SNR 2.5MS/s Output Data Rate ΔΣ ADC*, ISSCC 2005, Session 9, Switched Capacitor ΔΣ Modulators, 9.4, 3 pages.

Schmidt, *Offset, Flicker Noise, and Ways to Deal with Them*, Nov. 6, 2008, Institute of Microelectronics, University of Applied Sciences Northwestern Switzerland, 21 pages.

*The Integrator Amplifier*, downloaded Jan. 4, 21, www.electronics-tutorials.ws/opamp/opamp_6.html, 6 pages.

Brewer et al., *A 100dB SNR 2.5MS/s Output Data Rate ΔΣ ADC*, ISSCC 2005 IEEE International Digest of Technical Papers, Solid-State Circuits Conference, 2005, 28 pages.

Razavi, *The Switched-Capacitor Integrator*, IEEE Solid-State Circuits Magazine, Winter 2017, 3 pages.

"U.S. Appl. No. 16/990,521, Notice of Allowance mailed Jul. 13, 2021", 8 pgs.

* cited by examiner

SWITCHED-CAPACITOR INTEGRATORS WITH IMPROVED FLICKER NOISE REJECTION

TECHNICAL FIELD OF THE DISCLOSURE

The present disclosure relates generally to electronic devices and, more particularly, to switched-capacitor integrators.

BACKGROUND

Switched-capacitor (SC) circuits are critical blocks of various discrete-time systems. For example, SC circuits may be used to implement various transfer functions in precision analog and high dynamic range mixed-signal applications. A SC integrator is a type of a SC circuit that includes one or more sampling capacitors for storing charges based on sampling an input signal to the integrator, and further includes an amplifier for amplifying and transferring the charges stored on the one or more sampling capacitors to an integrating capacitor coupled to the amplifier. A SC integrator is referred to as "double-sampling" when it includes two sampling capacitors. SC integrators may, e.g., be used as analog loop filters in modulators of analog-to-digital converters (ADCs), e.g., of delta-sigma ADCs.

Since SC integrators are implemented with active devices (e.g., oftentimes a metal-oxide-semiconductor field-effect transistors (MOSFETs) in the amplifier), the signal being processed may be corrupted by flicker noise. Flicker noise is inversely proportional to frequency of the signal being processed, and, hence, narrow-bandwidth signals are more susceptible to flicker noise than wide-bandwidth signals.

Designing a SC integrator with acceptable flicker noise is not a trivial task because each application may have different needs in terms of various design parameters such as performance, power, cost, and size. As the applications needing SC integrators grow, the need for SC integrators with improved flicker noise rejection over a wide range of signal frequencies also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
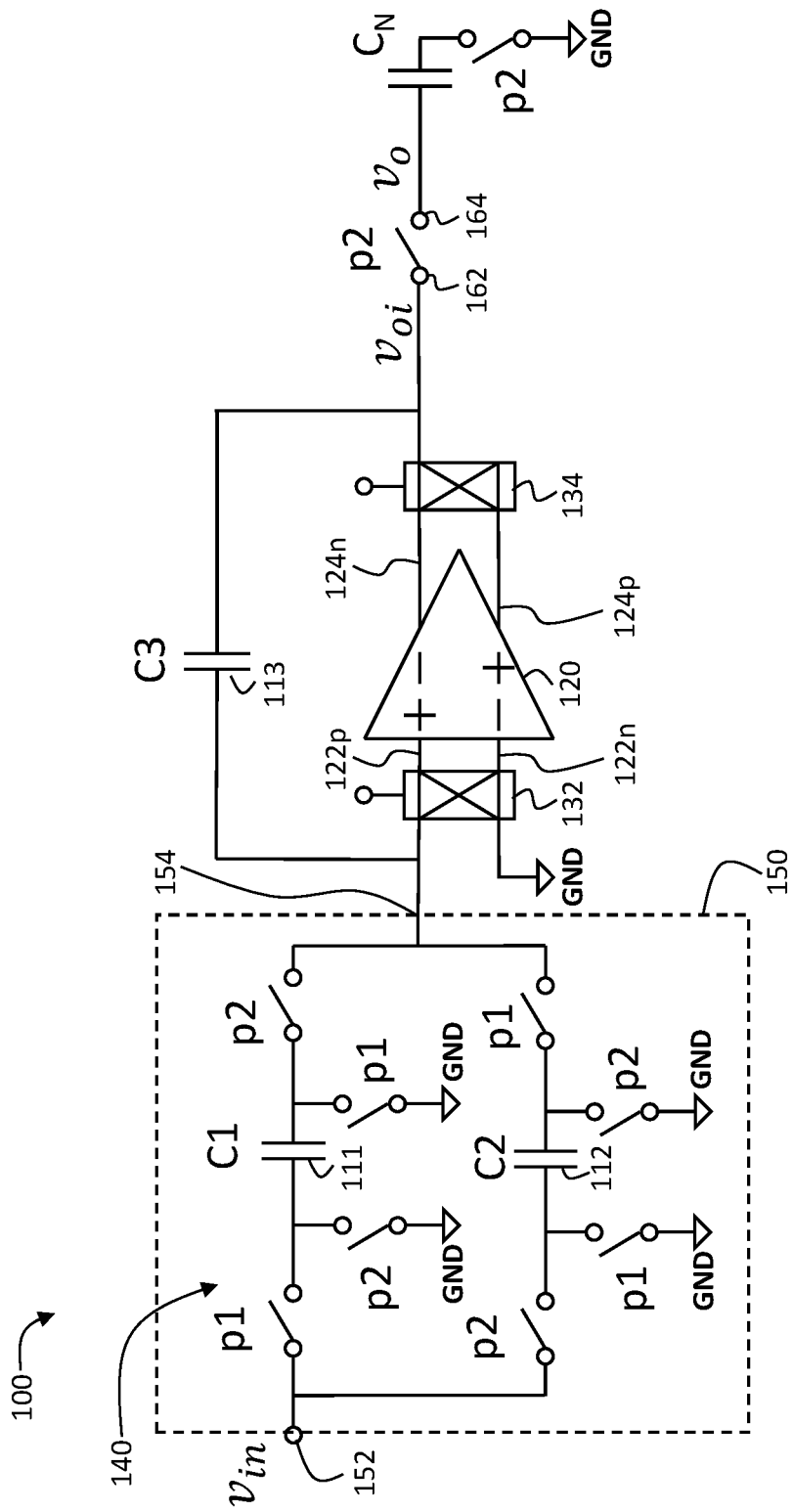
FIG. 1 provides an electric circuit diagram of a conventional double-sampling SC integrator.

The systems, methods, and devices of this disclosure each have several innovative aspects, no single one of which is solely responsible for all of the desirable attributes disclosed herein. Details of one or more implementations of the subject matter described in this specification are set forth in the description below and the accompanying drawings.

Embodiments of the present disclosure provide devices and methods that aim to improve flicker noise rejection (i.e., to reduce or eliminate flicker noise) in SC integrators, in particular, in double-sampling SC integrators. An example SC integrator includes a first and a second sampling capacitors (i.e., the SC integrator is a double-sampling SC integrator), an amplifier, an integrating capacitor, coupled at least to an output of the amplifier, and a switching arrangement. The switching arrangement is configured to, during a single cycle of a master clock, enable the first sampling capacitor to accumulate a first charge, indicative of a sample of an input signal accumulated during a first time period, and enable the second sampling capacitor to accumulate a second charge, indicative of a sample of the input signal accumulated during a second time period. During the same cycle of the master clock, the switching arrangement is further configured to enable the integrating capacitor to, in a third time period, integrate a charge indicative of at least a portion of the sample of the input signal accumulated by the first sampling capacitor during the first time period and a sample of a flicker noise of the amplifier at an end of the third time period, and, in a fourth time period, integrate a charge indicative of at least a portion of the sample of the input signal accumulated by the second sampling capacitor during the second time period and an inverted version of a flicker noise of the amplifier at an end of the fourth time period, where a time difference between an end of the third time period and an end of the fourth time period is independent of the duration of the clock cycle or the frequency of the master clock. By adding (i.e., integrating in the integrating capacitor) sign-inverted (i.e., chopped) samples of the amplifier flicker noise at every clock cycle of the master clock and by keeping the time distance/delay between those samples relatively small regardless (i.e., independent) of the master clock frequency, such a SC integrator may provide improvements in terms of rejecting the flicker noise of the amplifier.

As will be appreciated by one skilled in the art, at least some aspects of the present disclosure, in particular at least some aspects of providing SC integrators with improved flicker noise rejection as described herein, may be embodied in various manners, e.g., as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." At least some functions described in this disclosure (e.g., at least operation of the switching arrangements of various SC integrators with improved flicker noise rejection as described herein) may be implemented as an algorithm executed by one or more hardware processing units, e.g., one or more microprocessors of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g., to the existing SC integrators, ADCs incorporating existing SC integrators, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, some embodiments can incorporate any suitable combination of features from two or more drawings. Further, it will be understood that certain embodiments can include more elements than illustrated in a drawing and/or a subset of the elements illustrated in a drawing. For example, each of the components (e.g., each of the capacitors) illustrated in the electric circuit diagrams of the present drawings may be implemented as a plurality of such components which, equivalently, act as the components described herein. In another example, various circuits described herein may include further components that are not specifically illustrated in the present drawings, such as resistors, further capacitors, various electrical interconnects (i.e., electrically-conductive structures configured to provide electrical connectivity between various circuit components), etc.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Sometimes, in the present descriptions, the term "circuit" or the term "terminal" may be omitted (e.g., various SC integrator circuits shown in the electric circuit diagrams of the present drawings may be referred to in the present descriptions as "SC integrators," or various input and output terminals may be referred to as "inputs" and "outputs"). If used, the terms "substantially," "approximately," "about," etc., may be used to generally refer to being within +/−20% of a target value, e.g., within +/−10% of a target value, based on the context of a particular value as described herein or as known in the art.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Other features and advantages of the disclosure will be apparent from the following description and the claims.

Conventional Operation of a Double-Sampling SC Integrator

For purposes of illustrating double-sampling SC integrators with improved flicker noise rejection, proposed herein, it might be useful to first understand phenomena that may come into play in SC integrators. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides an electric circuit diagram of a conventional double-sampling SC integrator 100. As shown in FIG. 1, the SC integrator 100 includes a first capacitor (C1) 111, a second capacitor (C2) 112, an amplifier (A1) 120, and a third capacitor (C3) 113, coupled to the amplifier 120. The first and second capacitors 111 and 112 may be referred to as "sampling capacitors" of the SC integrator 100, while the third capacitor 113 may be referred to as an "integrating capacitor" of the SC integrator 100. The SC integrator 100 further includes a chopper circuit, shown in FIG. 1 as having an input chopper circuit portion 132 and an output chopper circuit portion 134. Furthermore, the SC 100 also includes a switching arrangement 140 of switches p1 and p2. A portion of the SC integrator 100 surrounded by a dashed contour may be referred to as a charging circuit 150. The charging circuit 150 may have an input 152, an output 154, the first and second capacitors 111, 112, and some of the switches p1 and p2 of the switching arrangement 140, as shown in FIG. 1. The input 152 of the charging circuit 150 is also an input of the SC integrator 100. An output of the SC integrator 100 is shown in FIG. 1 as an output 164. FIG. 1 further shows a terminal 162, coupled to the output of the amplifier 120 and to the third capacitor 113, and a switch p2 that may either couple or de-couple the terminal 162 to the output 164 of the SC integrator 100. The output 164 may also be coupled to a capacitor ($C_N$) 114, which may be a sampling capacitor of the following stage of a device, such as an ADC, where the SC integrator 100 may be implemented.

The amplifier 120 may be a differential amplifier having a differential input and a differential output. The differential input of the amplifier 120 is shown in FIG. 1 with two input terminals 122p and 122n (where the terminal 122p is a positive input of the differential input of the amplifier 120 and the terminal 122n is a negative input of the differential input of the amplifier 120). Similarly, the differential output of the amplifier 120 is shown in FIG. 1 with two output terminals 124p and 124n (where the terminal 124p is a positive output of the differential output of the amplifier 120 and the terminal 124n is a negative output of the differential output of the amplifier 120). In general, the third capacitor 113 is coupled to at least the output of the amplifier 120. In some embodiments, the third capacitor 113 may be coupled between the input and the output of the amplifier 120 by, e.g., having a first capacitor electrode of the capacitor 113 coupled to either the positive input 122p or the negative input 122n via the input chopper circuit portion 132, and having a second capacitor electrode of the capacitor 113 coupled to either the positive output 124p or the negative output 124n via the output chopper circuit portion 134.

During operation of the SC integrator 100, the chopper circuit is configured to be either in a first state or in a second state. In the first state, the input chopper circuit portion 132 of the chopper circuit may couple the output 154 of the charging circuit 150 to the positive input 122p of the differential input of the amplifier 120 and the output chopper circuit portion 134 of the chopper circuit may couple the negative output 124n of the differential output of the amplifier 120 to the third capacitor 113 and to the terminal 162. In the second state, the input chopper circuit portion 132 of the chopper circuit may couple the output 154 of the charging circuit 150 to the negative input 122n of the differential input of the amplifier 120 and the output chopper circuit portion 134 of the chopper circuit may couple the positive output 124p of the differential output of the amplifier 120 to the third capacitor 113 and to the terminal 162. Thus, when the chopper circuit is in the second state, polarity of the input to the amplifier 120 is inverted compared to polarity of the input to the amplifier 120 when the chopper circuit is in the first state, and, similarly, polarity of the output from the amplifier 120 is inverted compared to polarity of the output from the amplifier 120 when the chopper circuit is in the first state. Because the chopper circuit is configured to invert polarity of the input and the output of the amplifier 120, the chopper circuit may also be referred to as a "polarity inversion circuit/arrangement."

Each of the switches of the switching arrangement 140 and of other switching arrangements described herein (e.g., the switching arrangements shown in FIGS. 4, 6, and 8) may also be configured to be either in a first state or in a second state. The first state of a switch may be a state where a current may be conducted through the switch (e.g., the switch may be closed), while the second state may be a state where a current may not be conducted through the switch (e.g., the switch may be opened). Thus, when a switch is in the first state, the switch may couple components coupled to the different terminals of the switch, while the switch is in the second state, the switch may de-couple these components. The states of the switches may be controlled by providing respective control signals to the switches, with some example control signals for the switches being shown in the timing diagrams of FIGS. 2, 3, 5, and 7. In these timing diagrams, a given control signal having a high value indicates a time period during which the switch is configured to be in the first state, while the control signal having a low value indicates a time period during which the switch is configured to be in the second state (although, in other embodiments, this notation may be reversed so that a given control signal having a high value may configure the switch to be in the second state, while the control signal having a low value may configure the switch to be in the second state). A given control signal labeled in the timing diagrams presented herein with a label of a particular switch may be used to control the states of a plurality of such switches. For example, a control signal labeled in FIG. 2 as "p1" is a control signal that may be used to control the states of a plurality of switches p1 shown in FIG. 1 (namely, of 4 switches p1). In various embodiments, the switches described herein may be implemented in any suitable manner, e.g., as transistors, as known in the art. For example, when a switch is implemented as a field-effect transistor (FET), the switch may be placed in the first or in the second state by applying a suitable control signal to the gate terminal of the FET so that a current of a certain minimum value may be conducted or not conducted between the source and the drain terminals of the FET. For example, such a switch may be configured to be in the first state by applying to the gate terminal of the FET a voltage greater than the threshold voltage of the FET, to enable current to be conducted between the source and the drain terminals of the FET; or such a switch may be configured to be in the second state by not applying any voltage to the gate terminal or applying to the gate terminal of the FET a voltage smaller than the threshold voltage of the FET, to disable intentional conduction of current between the source and the drain terminals of the FET (there may still be unintentional leakage current conducted between the source and the drain terminals of the FET when the switch is supposed to be in the second state, but the amount of the leakage current may be much smaller than the intentional current conducted in the first state).

Figure 2:
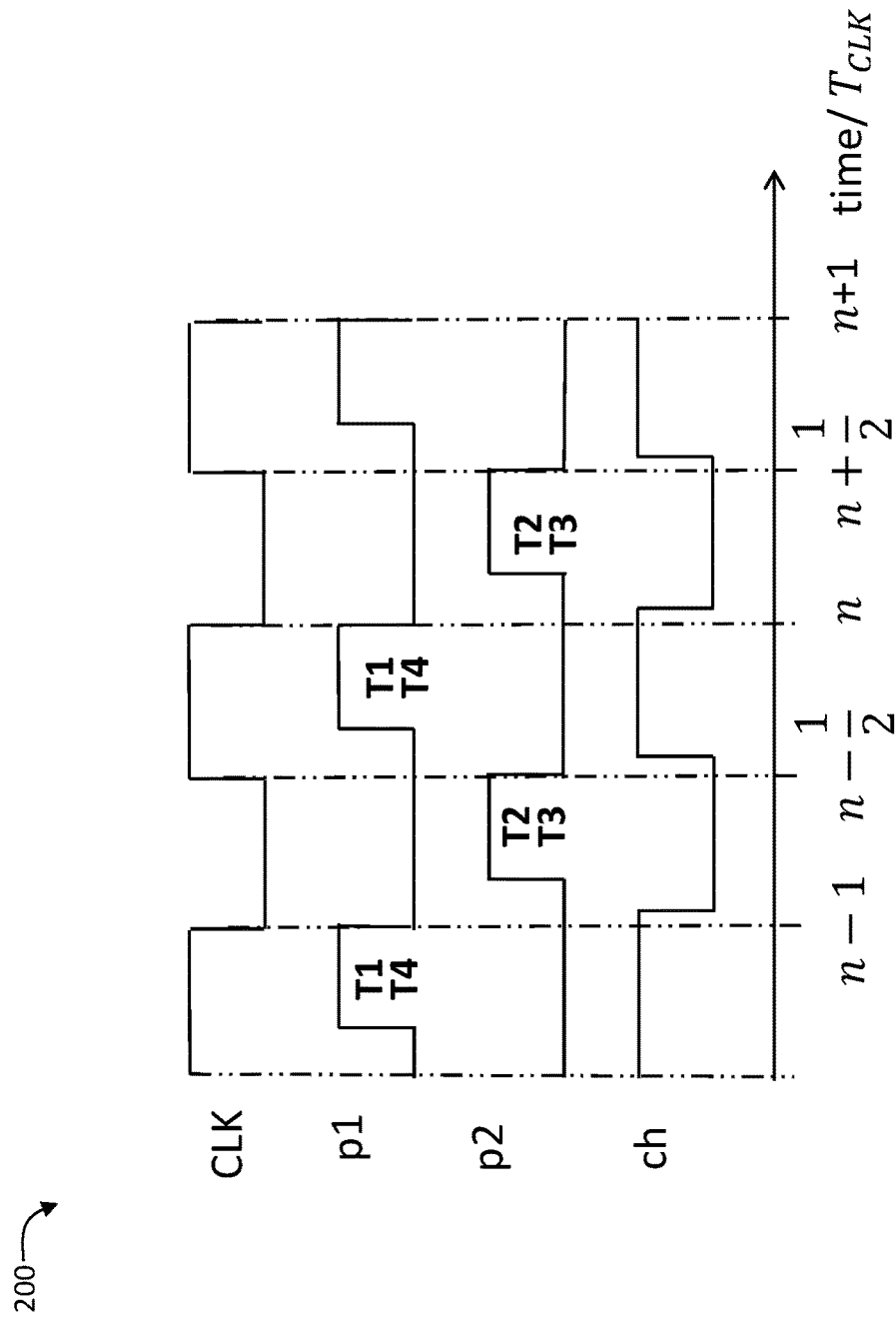
FIG. 2 provides a conventional timing diagram for operating the double-sampling SC integrator of FIG. 1.

FIG. 2 provides a conventional timing diagram 200 for operating the double-sampling SC integrator 100 of FIG. 1. The notation of the timing diagram 200 is as follows. The horizontal axis of the timing diagram 200 illustrates a time, normalized with respect to a period $T_{CLK}$ of a master clock (CLK) configured to clock the timing of various components of the SC integrator 100, where n is a positive integer indicating a number of a clock cycle of the master clock. Thus, the time period between (n−1) and (n) of the timing diagram 200 is one clock cycle and the time period between (n) and (n+1) is a next clock cycle, and so on. Alternatively, the time period between (n−½) and (n+½) of the timing diagram 200 may be one clock cycle, and so on. Above the horizontal axis, the timing diagram 200 illustrates a master clock signal (CLK), a control signal (p1) configured to control the states of the switches p1, a control signal (p2) configured to control the states of the switches p2, and a control signal (ch) configured to control the state of the chopper circuit portions 132, 134. Labels T1, T2, T3, and T4 shown in the timing diagram 200 illustrate, respectively, a first, a second, a third, and a fourth time periods (which may also be referred to as "phases"), described below.

As shown in FIG. 2, the switching arrangement 140 of the SC integrator 100 is configured to perform the following actions within a time period of a single clock cycle of the master clock.

In the first time period/phase T1, the switching arrangement 140 is configured to enable the first sampling capacitor 111 to accumulate a first charge indicative of a sample of an input signal (e.g., an input voltage $v_{in}$) at the input 152 (i.e., the first sampling capacitor 111 is charging). In order for the sampling capacitor 111 to accumulate charge during the time period T1, the switching arrangement 140 may couple the sampling capacitor 111 to the input 152 and de-couple the sampling capacitor 111 from the output 154. In the SC integrator 100, the sampling capacitor 111 may be coupled to the input 152 by having one capacitor electrode of the sampling capacitor 111 be coupled to the input 152 and the other capacitor electrode of the sampling capacitor 111 be coupled to the ground potential by virtue of the two switches p1, coupled to the different capacitor electrodes of the sampling capacitor 111, being in the first state. On the other hand, the sampling capacitor 111 of the SC integrator 100 may be de-coupled from the output 154 by having one capacitor electrode of the sampling capacitor 111 be de-coupled from the output 154 and the other capacitor electrode of the sampling capacitor 111 be de-coupled from the ground potential by virtue of the two switches p2, coupled to the different capacitor electrodes of the sampling capacitor 111, being in the second state. Thus, as shown in FIG. 2, during the time period T1, the switches p1 are in the first state and the switches p2 are in the second state.

In the second time period/phase T2, the switching arrangement 140 is configured to enable the second sampling capacitor 112 to accumulate a second charge indicative of a sample of an input signal (e.g., an input voltage $v_{in}$) at the input 152 (i.e., the second sampling capacitor 112 is charging). In order for the sampling capacitor 112 to accumulate charge during the time period T2, the switching arrangement 140 may couple the sampling capacitor 112 to the input 152 and de-couple the sampling capacitor 111 from the output 154. In the SC integrator 100, the sampling capacitor 112 may be coupled to the input 152 by having one capacitor electrode of the sampling capacitor 112 be coupled to the input 152 and the other capacitor electrode of the sampling capacitor 112 be coupled to the ground potential by virtue of the two switches p2, coupled to the different capacitor electrodes of the sampling capacitor 112, being in the first state. On the other hand, the sampling capacitor 112 of the SC integrator 100 may be de-coupled from the output 154 by having one capacitor electrode of the sampling capacitor 112 be de-coupled from the output 154 and the other capacitor electrode of the sampling capacitor 112 be de-coupled from the ground potential by virtue of the two switches p1, coupled to the different capacitor electrodes of the sampling capacitor 112, being in the second state. Thus, as shown in FIG. 2, during the time period T2, the switches p2 are in the first state and the switches p1 are in the second state.

In the third time period/phase T3, the switching arrangement 140 is configured to enable the integrating capacitor 113 integrate a charge indicative of at least a portion of the sample of the input signal accumulated by the first sampling capacitor 111 during the first time period T1 (i.e., the first sampling capacitor 111 is discharging so that the integrating capacitor 113 can integrate a third charge indicative of the first charge sampled by the first sampling capacitor 111 during the time period T1) and a sample of a flicker noise of the amplifier 120 at an end of the time period T3. In order for the integrating capacitor 113 to integrate the charge during the time period T3, the switching arrangement 140 may couple the first sampling capacitor 111 to the output 154, which is coupled to the input of the differential amplifier 120 via the chopping circuit being in the first state, and de-couple the second sampling capacitor 112 from the output 154. In the SC integrator 100, the sampling capacitor 111 may be coupled to the output 154 by having one capacitor electrode of the sampling capacitor 111 be coupled to the output 154 and the other capacitor electrode of the sampling capacitor 111 be coupled to the ground potential by virtue of the two switches p2, coupled to the different capacitor electrodes of the sampling capacitor 111, being in the first state. Thus, as shown in FIG. 2, during the time period T3, the switches p2 are in the first state and the switches p1 are in the second state.

In the fourth time period/phase T4, the switching arrangement 140 is configured to enable the integrating capacitor 113 integrate a charge indicative of at least a portion of the sample of the input signal accumulated by the second sampling capacitor 112 during the second time period T2 (i.e., the second sampling capacitor 112 is discharging so that the integrating capacitor 113 can integrate a fourth charge indicative of the second charge sampled by the second sampling capacitor 112 during the time period T2) and a sample of an inverted version of a flicker noise of the amplifier 120 at an end of the time period T4. In order for the integrating capacitor 113 to integrate the charge during the time period T4, the switching arrangement 140 may couple the second sampling capacitor 112 to the output 154, which is coupled to the input of the differential amplifier 120 via the chopping circuit being in the second state, and de-couple the first sampling capacitor 111 from the output 154. In the SC integrator 100, the sampling capacitor 112 may be coupled to the output 154 by having one capacitor electrode of the sampling capacitor 112 be coupled to the output 154 and the other capacitor electrode of the sampling capacitor 112 be coupled to the ground potential by virtue of the two switches p1, coupled to the different capacitor electrodes of the sampling capacitor 112, being in the first state. Thus, as shown in FIG. 2, during the time period T4, the switches p1 are in the first state and the switches p2 are in the second state.

As shown in the timing diagram 200, and as can also be seen by analyzing the arrangement of the switches p1 and p2 within the charging circuit 150 of the SC integrator 100, the time periods T1 and T4 are the same (meaning that when the first sampling capacitor 111 is charging, the second sampling capacitor 112 is discharging and that the beginning and end of the time period T1 coincides with, respectively, the beginning and end of the time period T4). Similarly, the time periods T2 and T3 are the same (meaning that when the second sampling capacitor 112 is charging, the first sampling capacitor 111 is discharging and that the beginning and end of the time period T2 coincides with, respectively, the beginning and end of the time period T3). As also shown in the timing diagram 200, the time periods T1 and T3 are non-overlapping (i.e., the first sampling capacitor 111 do not charge and discharge at the same time), the time periods T2 and T4 are non-overlapping (i.e., the second sampling capacitor 112 do not charge and discharge at the same time), the time periods T3 and T4 are non-overlapping (i.e., only one of the first sampling capacitor 111 and the second sampling capacitor 112 is discharging at a time), and the chopping circuit is in different states at least at the ends of the time periods T3 and T4 (e.g., the chopping circuit of the SC integrator 100 is in the first state at least at the end of the time period T4 and is in the second state at least at the end of the time period T3, as shown in FIG. 2, although in other embodiments the chopping circuit of the SC integrator 100 may be in the first state during the time period T3 and in the second state during the time period T4). In some embodiments of the SC integrator 100, the period of the chopping circuit control signal, ch, may be the same as the master clock period, $T_{CLK}$.

As further shown in the timing diagram 200, during conventional operation of the SC integrator 100, the falling edges of the control signals for the switches p1 and p2 may be synchronized with the respective falling and rising edges of the master clock signal CLK, e.g., the falling edge of the control signal for the switches p1 may happen at the time (n−1), corresponding to the falling edge of the master clock, and the falling edge of the control signal for the switches p2 may happen at the time (n−½), corresponding to the rising edge of the master clock, as shown in FIG. 2, although in other embodiments, the falling edges of the control signals for the switches p1 may be synchronized with the rising edges of the master clock signal CLK and the falling edges of the control signals for the switches p2 may be synchronized with the falling edges of the master clock signal CLK. In any of such embodiments, when the SC integrator 100 is operated according to the timing diagram 200, the time difference between the falling edges of p1 and p2 is ½$T_{CLK}$. Generating the falling edges of p1 and p2 aligned with the respectively falling/rising edges of the master clock CLK advantageously allows generating clean (i.e., low-jitter) falling edges of p1 and p2, which is good for maintaining integrity of the charge accumulated on the sampling capacitors 111 and 112. As can also be seen by analyzing the arrangement of the switches p1 and p2 within the charging circuit 140 of the SC integrator 100, the output signal (e.g., $v_o$) at the output 164 of the SC integrator 100 is sampled only once per master clock period. For the SC integrator 100 operated according to the timing diagram 200, the output signal at normalized time n may be computed according to the following equation (eq. 1):

$$v_o(n) = v_o(n-1) + \frac{1}{2}(v_{in}(n-\frac{1}{2}) + v_{in}(n-1)) + \frac{1}{2}(v_{fn}(n) - v_{fn}(n-\frac{1}{2})),$$

where $v_{fn}(n)$ and $v_{fn}(n-\frac{1}{2})$ represent the flicker noise samples of the amplifier 120 at times n and (n−½), respectively.

As the flicker noise can be assumed to change slowly with time, eq. 1 shows how the SC integrator 100 may substantially cancel the flicker noise of the amplifier 120. Such functionality is desirable because noise is a critical design parameter for a SC integrator as a SC integrator is often used in, e.g., the front end of SC sigma-delta modulators ADCs or noise shaping successive approximation routine (SAR) ADCs, where it defines the noise of the entire ADC.

The SC integrator 100 and the timing diagram 200 work well when the master clock signal has a period $T_{CLK}$ that is sufficiently small (i.e., the frequency of the master clock signal is sufficiently high) so that the sampling edges (i.e., the falling edges) of the switches p1 and p2 are sufficiently close to one another (i.e., so that the time difference of ½$T_{CLK}$ between the end of the time period T4 and the end of the time period T3 is sufficiently small) so that the flicker noise of the amplifier 120 at the end of the time period T3 is substantially the same as that at the end of the time period T4 and may, therefore, be effectively canceled by using the swap of the polarity in the time periods T3 and T4 implemented by the chopping circuit. However, it is often desirable to operate the SC integrator 100 with a wider master clock frequency range. Therefore, it is not always possible to keep the time difference between the end of the time period T4 and the end of the time period T3 of the SC integrator 100 sufficiently small. The master clock depends on the bandwidth of the input signal, $v_{in}$, in that, when the bandwidth of the input signal is lower, the master clock frequency should be lower as well. Lower master clock frequency means that the master clock is slower (i.e., the clock period $T_{CLK}$ is increased) and the pulses of the master clock signal CLK are more spread apart. Therefore, when the sampling edges of control signals p1 and p2 are aligned with the respective falling/rising edges of the master clock but slower master clock is used, the sampling edges of p1 and p2 will be farther apart, meaning that the flicker noise is sampled at points in time farther from one another and may no longer be substantially the same. Thus, sampling the flicker noise at points farther apart from one another degrades flicker noise rejection. In addition, flicker noise is larger for lower signal frequencies, further exacerbating this problem.

Operation of a Conventional Double-Sampling SC Integrator to Improve Flicker Noise Rejection As the foregoing illustrates, it is not desirable to use the timing diagram of FIG. 2 (i.e., to synchronize the falling edges of p1 and p2 with the rising/falling edges of the master clock) for lower-bandwidth signals/slower master clocks because, as the clock period $T_{CLK}$ increases, so does the distance in time between the two flicker noise samples. As a result, the flicker noise rejection is reduced, and the noise of the SC integrator 100 increases.

Figure 3:
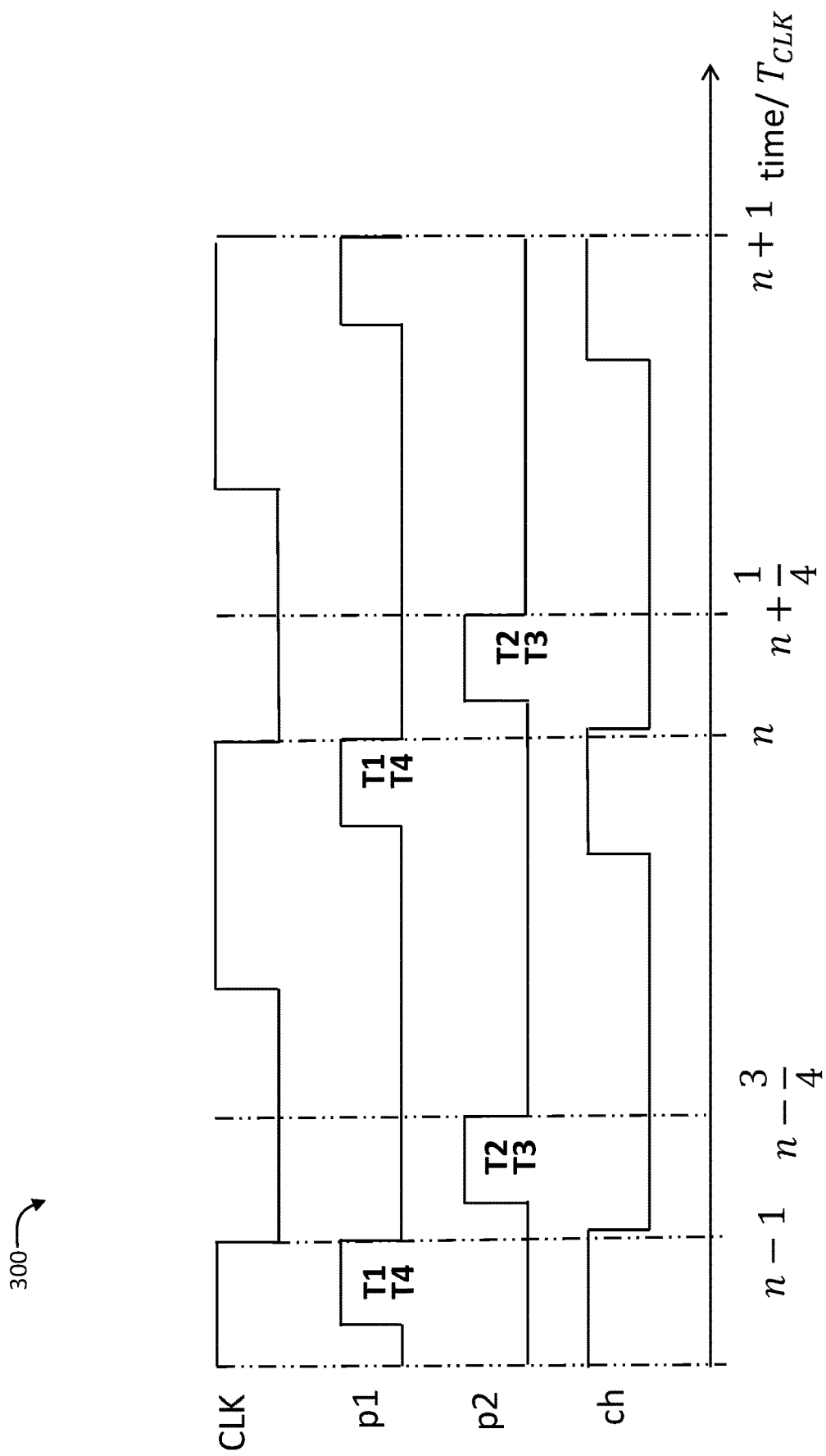
FIG. 3 provides a timing diagram for operating the double-sampling SC integrator of FIG. 1 in a manner that provides improved flicker noise rejection for a wider range of input signal frequencies, according to some embodiments of the present disclosure.

FIG. 3 provides a timing diagram 300 for operating the double-sampling SC integrator of FIG. 1 in a manner that provides improved flicker noise rejection for a wider range of input signal frequencies (and, correspondingly, for a wider range of master clock frequencies), according to some embodiments of the present disclosure. The timing diagram 300 is similar to the timing diagram 200 in the notation being used. What is different in the timing diagram 300 is that the master clock signal is slower than that shown in the timing diagram 200 (i.e., the clock period $T_{CLK}$ is larger), in particular 2 times slower, meaning that the clock period of the timing diagram 300 is 2 times larger than that of the timing diagram 200. What is also shown in FIG. 3 is that, in the timing diagram 300, the time period between the falling edges of T4 and T3 is no longer ½$T_{CLK}$ but is now ¼$T_{CLK}$. This means that even though the clock period of the timing diagram 300 is 2 times larger than that of the timing diagram 200, the actual time between the falling edges of p1 and p2 for the slower master clock of the timing diagram 300 is substantially the same as the actual time between the falling edges of p1 and p2 for the faster master clock of the timing diagram 200, meaning that the flicker noise rejection of the SC integrator 100 operated according to the timing diagram 300 will not be degraded with the respect to the case of operating the SC integrator 100 according to the timing diagram 200.

In various embodiments, the timing diagram 300 may be different from what is shown in FIG. 3 as long as the time difference between the end of the fourth time period T4 (i.e., the falling edge of p1) and the end of the third time period T3 (i.e., the falling edge of p2) is less than half of the clock cycle of the master clock $T_{CLK}$. The timing diagram 300 illustrates the first recognition on which embodiments of SC integrators with improved flicker noise rejection are based: the time difference between the end of the time period when the first sampling capacitor 111 is discharged (i.e., the falling edge of p2 of the SC integrator 100 or the falling edge of the time period T3, described herein) and the end of the time period when the second sampling capacitor 112 is discharged (i.e., the falling edge of p1 of the SC integrator 100 or the falling edge of the time period T4, described herein) may be independent of the clock cycle of the master clock. As the degree of cancellation of the flicker noise samples just depends on the time delay between them, the timing diagram can be modified to keep that delay constant and hence maintain good flicker noise rejection even when operating with a lower clock frequency.

Note that, for any timing of the operation of the SC integrator 100, between the falling edge of p2 and the rising edge of p1 the amplifier 120 is idle and could be powered off or placed in a low-power mode of operation, to save power. Alternatively, the amplifier 120 may be implemented as a dynamic amplifier, configured to only draw power during the time periods T3 and T4. In view of this, the timing diagram 300 may provide an additional advantage over the timing diagram 200 when employing dynamic components (e.g., dynamic amplifier 120) or by actively placing the amplifier 120 into a lower-power (or an off) mode in that, for the timing diagram 300 the time between the falling edge of p2 and the rising edge of p1 is greater than for the timing diagram 200. Phrased differently, another problem with the timing diagram 200 is that, even if the bandwidth of the input signal is relatively low, it might be desirable to reduce the master clock frequency because dynamic components may then consume less power. Then the same problem of the sampling edges of p1 and p2 being farther apart arises, which problem is solved by operating the SC integrator 100 in a manner that breaks the dependence of one or both of the sampling edges of p1 and p2 on the master clock signal, as illustrated in FIG. 3.

Example Double-Sampling SC Integrators with Improved Flicker Noise Rejection

Figure 5:
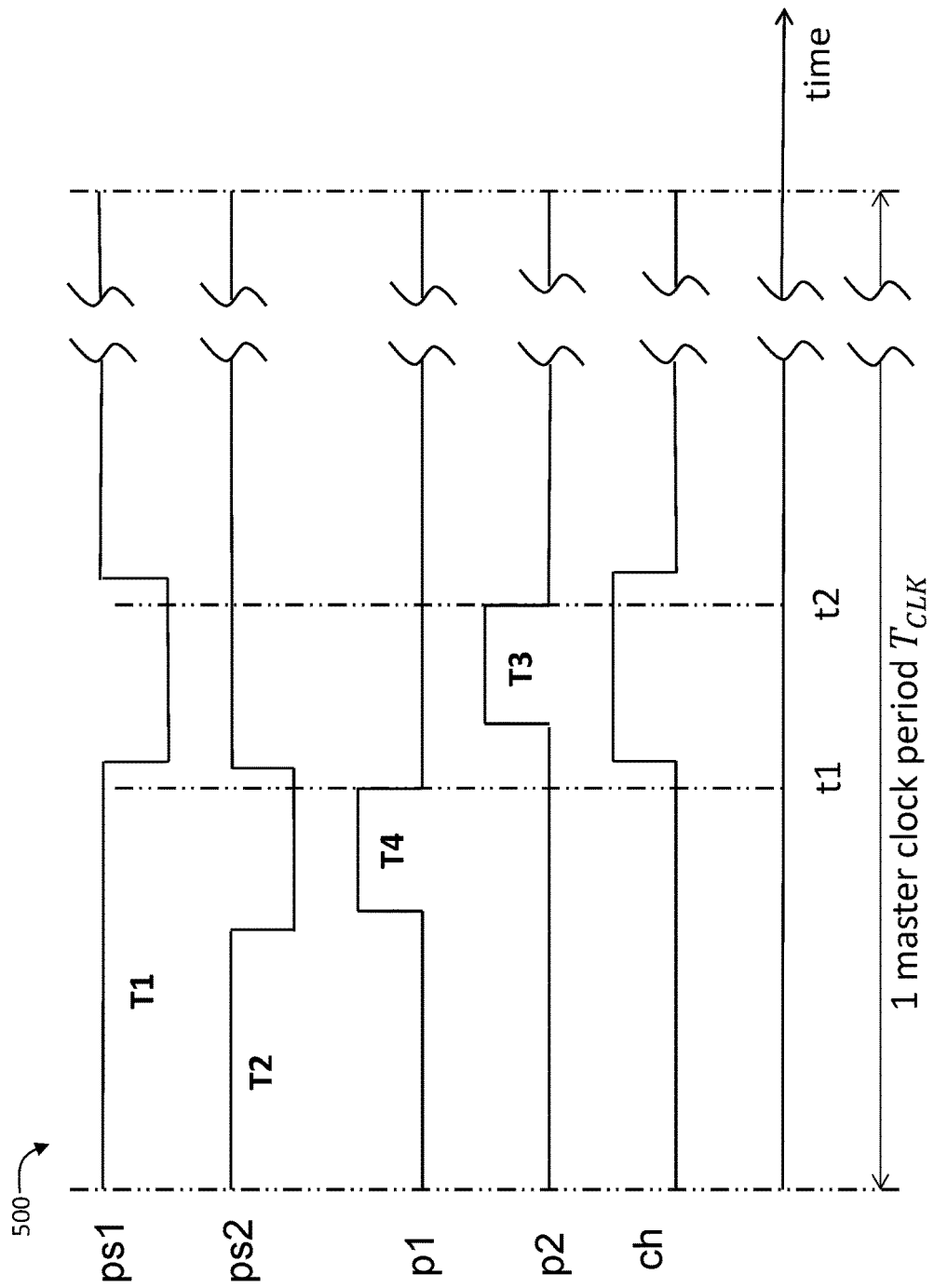
FIG. 5 provides a timing diagram for operating the double-sampling SC integrator of FIG. 4, according to some embodiments of the present disclosure.
Figure 6:
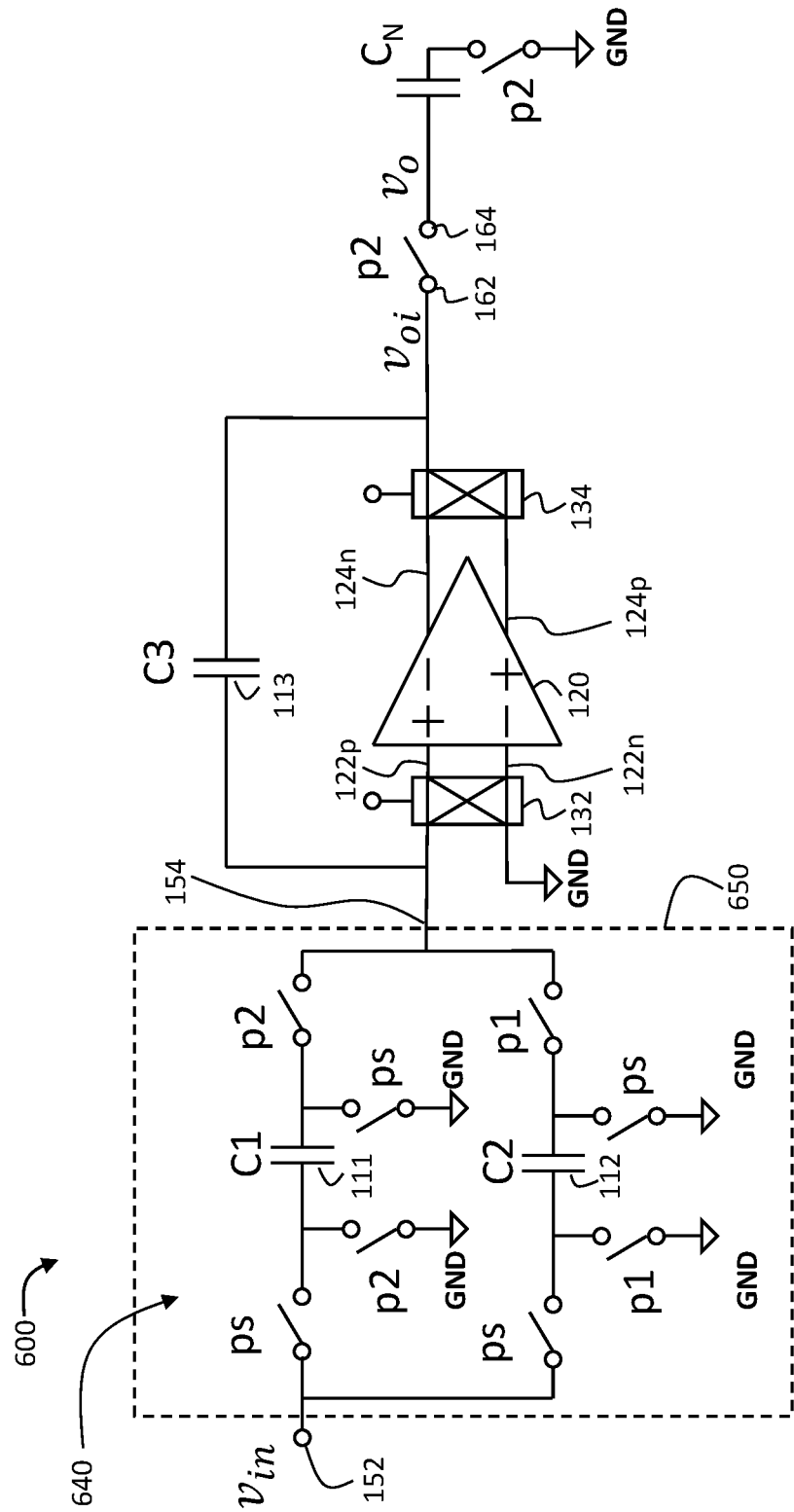
FIG. 6 provides an electric circuit diagram of a double-sampling SC integrator with improved flicker noise rejection, according to other embodiments of the present disclosure.
Figure 7:
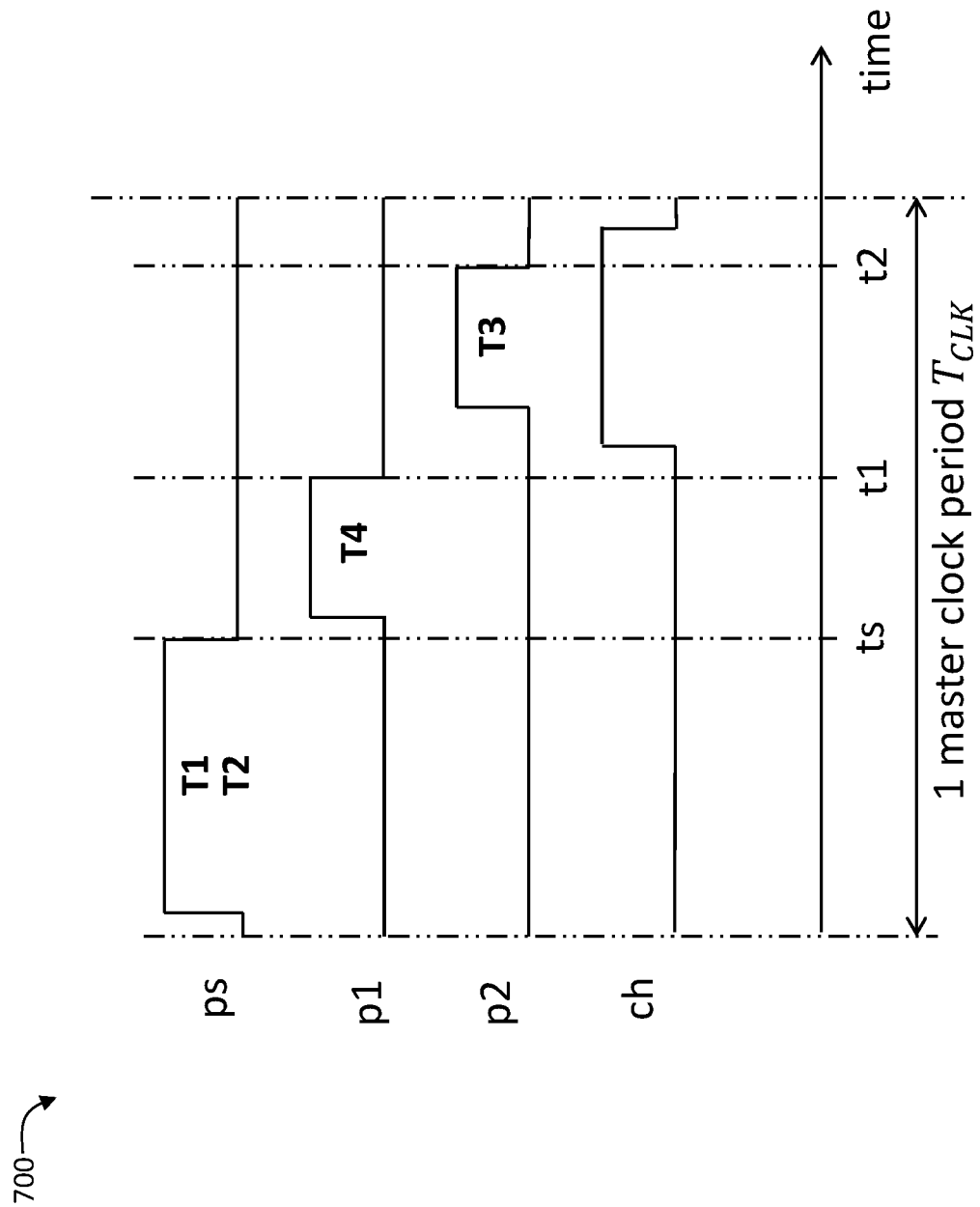
FIG. 7 provides a timing diagram for operating the double-sampling SC integrator of FIG. 6, according to some embodiments of the present disclosure.

While operating the SC integrator 100 according to the timing diagram 300 instead of the timing diagram 200 may provide advantages in terms of improved flicker noise rejection and reduced power consumption, operation according to the timing diagram 300 may increase jitter noise compared to the timing diagram 200. In the SC integrator 100, the input signal $v_{in}$ is sampled on both, the falling edge of p1 and the falling edge of p2, which means that jitter in generating these falling edges would increase jitter noise in the output 164. In the timing diagram 200, the falling edges p1 and p2 were aligned to the master clock and, therefore, were inherently low-jitter. In the timing diagram 300, the slower master clock of FIG. 3 is no longer convenient for generating clean (i.e., low-jitter) falling edges of p1 and p2, requiring some other timing mechanisms to generate these falling edges, which is likely to increase jitter. Generating low-jitter clock edge pulses p1 and p2 that are not aligned with the falling/rising edges of the master clock is not trivial. Therefore, further embodiments of the present disclosure provide double-sampling SC integrators with improved flicker noise rejection that aim to improve on this problem. One example of such further embodiment is illustrated in FIGS. 4 and 5, and another example is illustrated in FIGS. 6 and 7.

Figure 4:
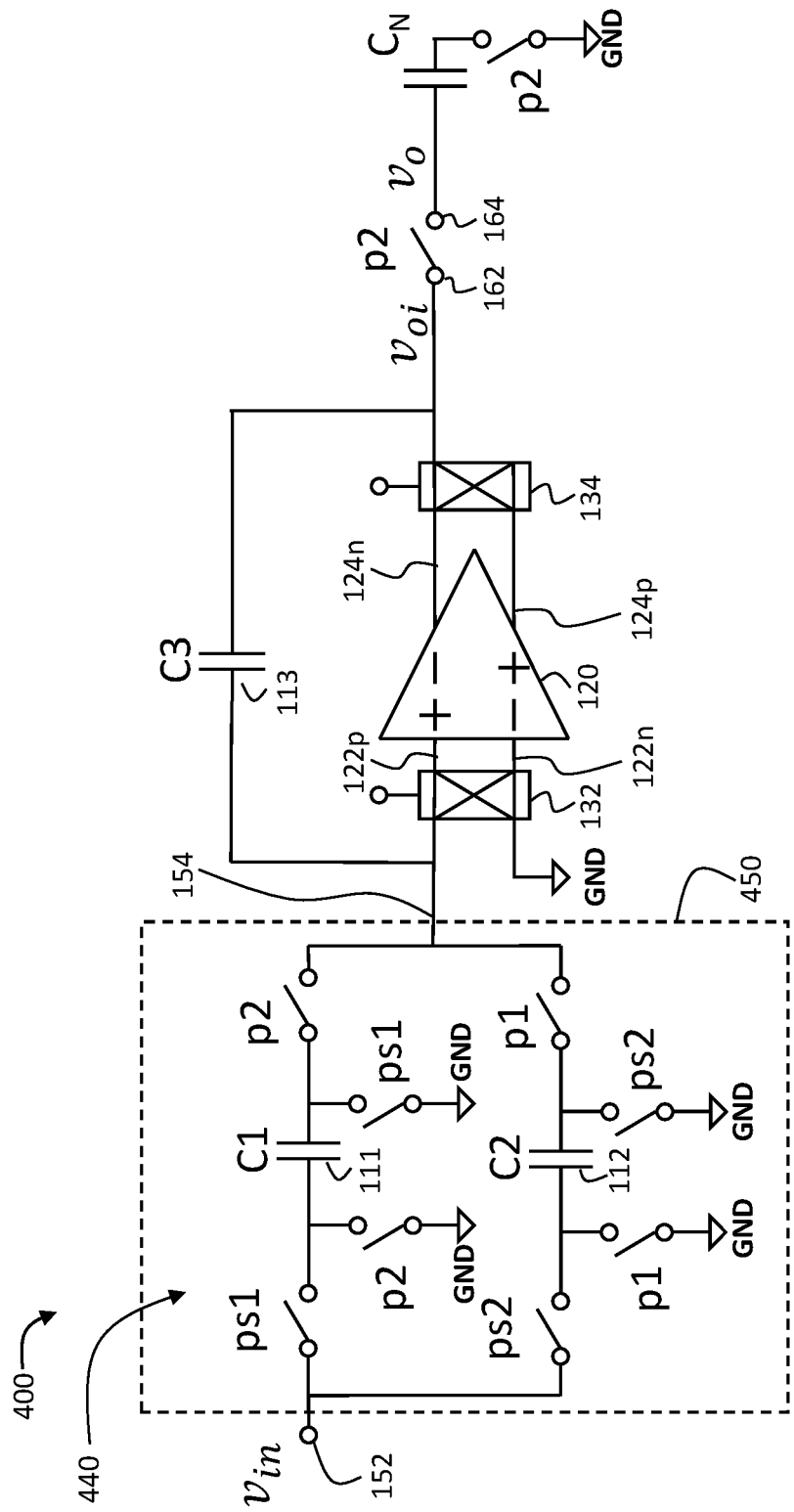
FIG. 4 provides an electric circuit diagram of a double-sampling SC integrator with improved flicker noise rejection, according to some embodiments of the present disclosure.

FIG. 4 provides an electric circuit diagram of a double-sampling SC integrator 400 with improved flicker noise rejection, according to some embodiments of the present disclosure. FIG. 5 provides a timing diagram 500 for operating the double-sampling SC integrator 400 of FIG. 4, according to some embodiments of the present disclosure. The SC integrator 400 is similar to the SC integrator 100, which is shown in FIG. 4 using some of the same reference numerals as those that were used for the SC integrator 100 of FIG. 1. The same reference numerals and letters used in FIG. 4 are intended to illustrate the same or analogous components as those described with reference to FIG. 1, so that, in the interests of brevity, their descriptions are not repeated with respect to FIG. 4 and only the differences are described. Similarly, the notation of the timing diagram 500 is analogous to that of the timing diagram 200 and, therefore, only the differences between these timing diagrams are described.

As shown in FIG. 4, similar to the SC integrator 100, the SC integrator 400 may include the first and second sampling capacitors 111 and 112, the amplifier 120, the integrating capacitor 113 coupled to the amplifier 120, and the chopper circuit having the input chopper circuit portion 132 and the output chopper circuit portion 134, as described above.

Similar to FIG. 1, FIG. 4 illustrates that the integrating capacitor 113 is coupled between the input and the output of the amplifier 120. For example, the first capacitor electrode of the integrating capacitor 113 may be coupled to the output 154 of the charging circuit or the input of the input chopper circuit portion 132, while the second capacitor electrode of the integrating capacitor 113 may be coupled to the terminal 162 or the output of the output chopper circuit portion 134. In such embodiments, when the first and second sampling capacitors 111 and 112 discharge in time periods T3 and T4 (sequentially), the charge accumulated in these capacitors may be transferred to the integrating capacitor 113. As a result, the integrating capacitor 113 would accumulate charge indicative of the charges that were sampled by the sampling capacitors 111, 112 in the time periods T1 and T2 by having at least a portion of this charge transferred from the sampling capacitors 111, 112. However, in other embodiments of the SC integrator 400, the first capacitor electrode of the integrating capacitor 113 may be coupled to a bias or a reference signal (e.g., a bias voltage or a ground potential) instead. In such embodiments, the second capacitor electrode of the integrating capacitor 113 would still be coupled to the output of the amplifier 120 by being coupled to the terminal 162 or the output of the output chopper circuit portion 134. Therefore, when the first and second sampling capacitors 111 and 112 are coupled to the amplifier in time periods T3 and T4 (sequentially), the voltage sampled in these capacitors may be applied to the amplifier 120, and then the integrating capacitor 113 would accumulate charge indicative of the charges that were sampled by the sampling capacitors 111, 112 in the time periods T1 and T2 based on the output of the amplifier 120. In such embodiments, the amplifier 120 would operate essentially as a transconductor: when the first sampling capacitor 111 is coupled to the output 154 and to the input of the amplifier 120 (via the input chopper circuit portion 132), the amplifier 120 will provide current at the output, which current will be fed (via the output chopper circuit portion 134) to the integrating capacitor 113, thus adding to the integrating capacitor 113 a charge proportional to the voltage/charge on the first sampling capacitor 111. Similar operation happens when the second sampling capacitor is couples to the input of the amplifier 120.

The SC integrator 400 differs from the SC integrator 100 in that the SC integrator 400 includes a switching arrangement 440 instead of the switching arrangement 140 shown in FIG. 1. Consequently, SC integrator 400 includes a charging circuit 450 instead of the charging circuit 150 shown in FIG. 1. Similar to FIG. 1, the charging circuit 450 may have the input 152, the output 154, the first and second sampling capacitors 111, 112, and some of the switches p1 and p2 of the switching arrangement 440, as shown in FIG. 4. Different from FIG. 1, the switching arrangement 440 further includes switches ps1 and ps2 and, therefore, the charging circuit 450 is different from the charging circuit 150 in that it includes the switches ps1 and ps2.

The switching arrangement 440 may be similar to the switching arrangement 140 in how the switches p2 may be used to couple/de-couple the first sampling capacitor 111 to/from the output 154 of the charging circuit 450 and in how the switches p1 may be used to couple/de-couple the second sampling capacitor 112 to/from the output 154 of the charging circuit 450. The switching arrangement 440 differs from the switching arrangement 140 in how the first sampling capacitor 111 and the second sampling capacitor 112 may be coupled/de-coupled to/from the input 152 of the charging circuit 450. As shown in FIG. 4, in the SC integrator 400, switches ps1 may be used to control coupling/de-coupling of the first sampling capacitor 111 to/from the input 152, while switches ps2 may be used to control coupling/de-coupling of the second sampling capacitor 112 to/from the input 152. As will be clear from the descriptions below, such implementation allows keeping the sampling phases of the two sampling capacitors distinct from one another and from the phases of when these sampling capacitors are discharged, providing advantages of flicker noise rejection similar to those of the timing diagram 300 while reducing or eliminating the jitter-related noise of the SC integrator 100.

The functionality of each the first, second, third, and fourth time periods/phases T1-T4 of the SC integrator 400 is substantially the same as those described with reference to the SC integrator 100, with the differences being in how that functionality is realized by the switching arrangement 440.

In the first time period/phase T1, the switching arrangement 440 is configured to enable the first sampling capacitor 111 to accumulate a first charge indicative of a sample of an input signal (e.g., an input voltage $v_{in}$) at the input 152 (i.e., the first sampling capacitor 111 is charging). In order for the sampling capacitor 111 to accumulate charge during the time period T1, the switching arrangement 440 may couple the sampling capacitor 111 to the input 152 and de-couple the sampling capacitor 111 from the output 154. In the SC integrator 400, the sampling capacitor 111 may be coupled to the input 152 by having one capacitor electrode of the sampling capacitor 111 be coupled to the input 152 and the other capacitor electrode of the sampling capacitor 111 be coupled to the ground potential by virtue of the two switches ps1, coupled to the different capacitor electrodes of the sampling capacitor 111, being in the first state. On the other hand, the sampling capacitor 111 of the SC integrator 400 may be de-coupled from the output 154 by having one capacitor electrode of the sampling capacitor 111 be de-coupled from the output 154 and the other capacitor electrode of the sampling capacitor 111 be de-coupled from the ground potential by virtue of the two switches p2, coupled to the different capacitor electrodes of the sampling capacitor 111, being in the second state. Thus, as shown in the timing diagram 500, during the time period T1, the switches ps1 are in the first state and the switches p2 are in the second state.

In the second time period/phase T2, the switching arrangement 440 is configured to enable the second sampling capacitor 112 to accumulate a second charge indicative of a sample of an input signal (e.g., an input voltage $v_{in}$) at the input 152 (i.e., the second sampling capacitor 112 is charging). In order for the sampling capacitor 112 to accumulate charge during the time period T2, the switching arrangement 440 may couple the sampling capacitor 112 to the input 152 and de-couple the sampling capacitor 111 from the output 154. In the SC integrator 400, the sampling capacitor 112 may be coupled to the input 152 by having one capacitor electrode of the sampling capacitor 112 be coupled to the input 152 and the other capacitor electrode of the sampling capacitor 112 be coupled to the ground potential by virtue of the two switches ps2, coupled to the different capacitor electrodes of the sampling capacitor 112, being in the first state. On the other hand, the sampling capacitor 112 of the SC integrator 400 may be de-coupled from the output 154 by having one capacitor electrode of the sampling capacitor 112 be de-coupled from the output 154 and the other capacitor electrode of the sampling capacitor 112 be de-coupled from the ground potential by virtue of the two switches p1, coupled to the different capacitor electrodes of the sampling capacitor 112, being in the second state. Thus, as shown in the timing diagram 500, during the time period T2, the switches ps2 are in the first state and the switches p1 are in the second state.

In the third time period/phase T3, the switching arrangement 440 is configured to enable the integrating capacitor 113 integrate a charge indicative of at least a portion of the sample of the input signal accumulated by the first sampling capacitor 111 during the first time period T1 (i.e., the switching arrangement 440 allows the first sampling capacitor 111 to discharge in a manner that the integrating capacitor 113 integrates a third charge indicative of the first charge sampled by the first sampling capacitor 111 during the time period T1). The switching arrangement 440 further allows a charge indicative of a sample of a flicker noise of the amplifier 120 at the end of the time period T3 to be integrated on the integrating capacitor 113. In order for the integrating capacitor 113 to integrate the charge during the time period T3, the switching arrangement 440 may de-couple the second sampling capacitor 112 from the output 154 and couple the first sampling capacitor 111 to the output 154 (while de-coupling the first sampling capacitor 111 from the input 152), thus coupling the first sampling capacitor 111 to the input of the differential amplifier 120 via the input chopping circuit portion 132 (which may be in the first state during the entire duration of the third period T3 or at least for a portion of time that include the end of the third period T3). In the SC integrator 400, the sampling capacitor 111 may be coupled to the output 154 by having one capacitor electrode of the sampling capacitor 111 be coupled to the output 154 and the other capacitor electrode of the sampling capacitor 111 be coupled to the ground potential by virtue of the two switches p2, coupled to the different capacitor electrodes of the sampling capacitor 111, being in the first state. Thus, as shown in the timing diagram 500, during the time period T3, the switches p2 are in the first state and the switches p1 are in the second state. In contrast to the timing diagrams 200 or 300, because in the SC integrator 400 discharging of the first sampling capacitor 111 is separated/de-coupled from charging of the second sampling capacitor 112 by virtue of using extra switches ps2 to enable charging of the second sampling capacitor 112, the time periods T3 and T2 may, but do not have to, overlap. The time period T3 may start any time after the first charge has been accumulated in the first sampling capacitor 111 (i.e., after the time period T1), to enable the integrating capacitor 113 to integrate the third charge indicative of the first charge, with the chopper circuit being in the first state at least at the end of third time period T3.

In the fourth time period/phase T4, the switching arrangement 440 is configured to enable the integrating capacitor 113 integrate a charge indicative of at least a portion of the sample of the input signal accumulated by the second sampling capacitor 112 during the second time period T2 (i.e., the switching arrangement 440 allows the second sampling capacitor 112 to discharge in a manner that the integrating capacitor 113 integrates a fourth charge indicative of the second charge sampled by the second sampling capacitor 112 during the time period T2). The switching arrangement 440 further allows a charge indicative of an inverted version of a sample of a flicker noise of the amplifier 120 at the end of the time period T4 to be integrated on the integrating capacitor 113. In order for the integrating capacitor 113 to integrate the charge during the time period T4, the switching arrangement 440 may de-couple the first sampling capacitor 111 from the output 154 and couple the second sampling capacitor 112 to the output 154 (while de-coupling the second sampling capacitor 112 from the input 152), thus coupling the second sampling capacitor 112 to the input of the differential amplifier 120 via the input chopping circuit portion 132 (which may be in the second state during the entire duration of the fourth period T4 or at least for a portion of time that include the end of the fourth period T4). In the SC integrator 400, the second sampling capacitor 112 may be coupled to the output 154 by having one capacitor electrode of the sampling capacitor 112 be coupled to the output 154 and the other capacitor electrode of the sampling capacitor 112 be coupled to the ground potential by virtue of the two switches p1, coupled to the different capacitor electrodes of the sampling capacitor 112, being in the first state. Thus, as shown in the timing diagram 500, during the time period T4, the switches p1 are in the first state and the switches p2 are in the second state. In contrast to the timing diagrams 200 or 300, because in the SC integrator 400 discharging of the second sampling capacitor 112 is separated/de-coupled from charging of the first sampling capacitor 111 by virtue of using extra switches ps1 to enable charging of the first sampling capacitor 111, the time periods T4 and T1 may, but do not have to, overlap. The time period T4 may start any time after the second charge has been accumulated in the second sampling capacitor 112 (i.e., after the time period T2), to enable the integrating capacitor 113 to integrate the fourth charge indicative of the second charge, with the chopper circuit being in the second state at least at the end of fourth time period T4.

It should be noted that, for the embodiments where the second sampling capacitor 112 is discharged before the first sampling capacitor 111 (i.e., the time period T4 happens before the time period T3 in a given time period equal to the master clock cycle, as is shown in the example of the timing diagram 500), the integrating capacitor 113 accumulates the third charge in addition to the fourth charge. In some such embodiments, the time difference between the end of the fourth time period/phase T4 (the end of T4 labeled in the timing diagram 500 as time "t1") and the end of the third time period/phase T3 (the end of T3 labeled in the timing diagram 500 as time "t2") may be less than half of a clock cycle of the master clock. On the other hand, for the embodiments where the first sampling capacitor 111 is discharged before the second sampling capacitor 112 (i.e., the time period T3 happens before the time period T4 in a given time period equal to the master clock cycle, not shown in the present timing diagrams), the integrating capacitor 113 accumulates the fourth charge in addition to the third charge. In some such embodiments, the time difference between the end of the third time period/phase T3 and the end of the fourth time period/phase T4 may be less than half of a clock cycle of the master clock. In either case, the output signal (e.g., $v_o$) at the output 164 of the SC integrator 400 is then based on a combination (e.g., a sum) of the third charge and the fourth charge accumulated by the integrating capacitor 113. In some embodiments, the switching arrangement 440 may include an additional switch p2 or p1 to couple the terminal 162 to the terminal 164. For example, for the embodiments where the second sampling capacitor 112 is discharged before the first sampling capacitor 111 (i.e., the time period T4 happens before the time period T3 in a given time period equal to the master clock cycle, as is shown in the example of the timing diagram 500), the switching arrangement 440 may include an additional switch p2 to couple the terminal 162 to the terminal 164, as shown in FIG. 4, thus coupling the integrating capacitor 113 to the output 164 of the SC integrator 400 during the third time period/phase T3. On the other hand, for the embodiments where the first sampling capacitor 111 is discharged before the second sampling capacitor 112 (i.e., the time period T3 happens before the time period T4 in a given time period equal to the master clock cycle, not shown in the present timing diagrams), the switching arrangement 440 may include an additional switch p1 to couple the terminal 162 to the terminal 164 (i.e., the switch p2 between the terminals 162 and 164, shown in FIG. 4, would be replaced with a switch p1), thus coupling the integrating capacitor 113 to the output 164 of the SC integrator 400 during the fourth time period/phase T4.

As described above, the chopping circuit needs to be in different states at the end of the discharging of the first sampling capacitor 111 and at the end of discharging the second sampling capacitor 112. For example, the chopping circuit may be in the first state at the end of the discharging of the first sampling capacitor 111 and in the second state at the end of discharging the second sampling capacitor 112. This is illustrated in the timing diagram 500 by showing that the chopping circuit may switch from being in the second state to being in the first state after the falling edge of p1 (i.e., after the end of T4) but before the rising edge of p2 (i.e., before the beginning of T3) and then may switch from being in the first state to being in the second state after the falling edge of p2 (i.e., after the end of T3) but before the rising edge of p1 (i.e., before the beginning of T4). However, in other embodiments, the timing of this switching between the first and second states may be different from what is shown in FIG. 5. For example, in some embodiments, if the time period T3 takes place before the time period T4, the chopper circuit may switch from being in the first state to being in the second state after the end of the time period T3 and between the beginning of the time period T4. In such embodiments, the chopper circuit may be in the second state during the entire duration of the time period T4. However, in other embodiments when the time period T3 takes place before the time period T4, the chopper circuit may switch from being in the first state to being in the second state during the time period T4, e.g., as long as there is enough time left in the time period T4 after the change of the state of the chopping circuit to settle the disturbances caused by the change. In another example, in some embodiments, if the time period T4 takes place before the time period T3, the chopper circuit may switch from being in the second state to being in the first state after the end of the time period T4 and between the beginning of the time period T3. In such embodiments, the chopper circuit may be in the first state during the entire duration of the time period T3. However, in other embodiments when the time period T4 takes place before the time period T3, the chopper circuit may switch from being in the second state to being in the first state during the time period T3, e.g., as long as there is enough time left in the time period T3 after the change of the state of the chopping circuit to settle the disturbances caused by the change.

As shown in the timing diagram 500, and as can also be seen by analyzing the arrangement of the switches ps1, ps2, p1, and p2 within the charging circuit 450 of the SC integrator 400, the time periods T1 and T4 may overlap (meaning that for at least a portion of the time when the first sampling capacitor 111 is charging, the second sampling capacitor 112 may be discharging) but the lengths of these time periods may be different (e.g., the time period T4 may be shorter than the time period T1). Thus, in some embodiments of operating the SC integrator 400, the time periods T1 and T4 may overlap but the beginning of the fourth time period T4 does not coincide with the beginning of the first time period T1 and/or the end of the fourth time period T4 does not coincide with the end of the first time period T1, in contrast to operation of the SC integrator 100. Similarly, the time periods T2 and T3 may overlap (meaning that for at least a portion of the time when the second sampling capacitor 112 is charging, the first sampling capacitor 111 may be discharging) but the lengths of these time periods may be different (e.g., the time period T3 may be shorter than the time period T2). Thus, in some embodiments of operating the SC integrator 400, the time periods T2 and T3 may overlap but the beginning of the third time period T3 does not coincide with the beginning of the second time period T2 and/or the end of the third time period T3 does not coincide with the end of the second time period T2, in contrast to operation of the SC integrator 100. Also in contrast to operation of the SC integrator 100, in some embodiments of operating the SC integrator 400, the first time period T1 may at least partially overlaps with the second time period T2, meaning that the first and second sampling capacitors 111, 112 may be charging at the same time at least for a portion of their respective charging time periods.

Similar to operation of the SC integrator 100, for operation of the SC integrator 400, as also shown in the timing diagram 500, the time periods T1 and T3 are non-overlapping (i.e., the first sampling capacitor 111 does not charge and discharge at the same time), the time periods T2 and T4 are non-overlapping (i.e., the second sampling capacitor 112 does not charge and discharge at the same time), the time periods T3 and T4 are non-overlapping (i.e., only one of the first sampling capacitor 111 and the second sampling capacitor 112 is discharging at a time), and the chopping circuit is in different states at least at the ends of the time periods T3 and T4 (e.g., the chopping circuit of the SC integrator 400 is in the first state at least at the end of the time period T4 and is in the second state at least at the end the time period T3, as shown in FIG. 5, although in other embodiments the designation of the first and second states of the chopping circuit of the SC integrator 400 may be reversed). In some embodiments of the SC integrator 400, the period of the chopping circuit control signal, ch, may be the same as the master clock period, $T_{CLK}$.

The timing diagram 500 of FIG. 5 may advantageously maintain a relatively short time delay between the samples of the flicker noise of the amplifier 120, and, hence, yield a good rejection of it. Longer clock master clock periods may be accommodated by extending the phases ps1 and ps2 (i.e., by extending the time periods T1 and T2), while keeping the duration of the p1 and p2 phases substantially the same (i.e., without extending the duration of the time periods T3 and T4). In some embodiments, the time periods T1 and T2 may be longer than the time periods T3 and T4, and the time periods T1 and T2 may get even longer at lower master clock frequencies, giving more time for an input buffer for the SC integrator 400 (the input buffer not shown in FIG. 4) to drive the input voltage $v_{in}$ and reduce the power consumption of the input buffer.

Another example of a double-sampling SC integrator with improved flicker noise rejection is shown in FIGS. 6 and 7. FIG. 6 provides an electric circuit diagram of a double-sampling SC integrator 600 with improved flicker noise rejection, according to other embodiments of the present disclosure. FIG. 7 provides a timing diagram 700 for operating the double-sampling SC integrator 600 of FIG. 6, according to some embodiments of the present disclosure. The SC integrator 600 is similar to the SC integrator 400, which is shown in FIG. 6 using some of the same reference numerals as those that were used for the SC integrator 400 of FIG. 4. The same reference numerals and letters used in FIG. 6 are intended to illustrate the same or analogous components as those described with reference to FIG. 4, so that, in the interests of brevity, their descriptions are not repeated with respect to FIG. 6 and only the differences are described. Similarly, the notation of the timing diagram 700 is analogous to that of the timing diagram 500 and, therefore, only the differences between these timing diagrams are described.

The SC integrator 600 differs from the SC integrator 400 in that the SC integrator 600 includes a switching arrangement 640 instead of the switching arrangement 440 shown in FIG. 4. Consequently, SC integrator 600 includes a charging circuit 650 instead of the charging circuit 450 shown in FIG. 4. Similar to FIG. 4, the charging circuit 650 may have the input 152, the output 154, the first and second sampling capacitors 111, 112, and the switches p1 and p2 of the switching arrangement 640, as shown in FIG. 6. Different from FIG. 4, instead of including individual switches ps1 and ps2 to couple/de-couple each of the first and second sampling capacitors 111, 112 to/from the input 152, the switching arrangement 640 uses switches ps for that purpose. In other words, in the SC integrator 600, couple/de-coupling of the first and second sampling capacitors 111, 112 to/from the input 152 is controlled by a single control signal ps, instead of being individually controlled by respective control signal for different sampling capacitors in the embodiment of the SC integrator 400. This means that the timing of operation of the SC integrator 600 may be substantially the same as that of the SC integrator 400, an example of the former shown in the timing diagram 700, except that the first and second time periods/phases T1 and T2 substantially coincide for the SC integrator 600. As is shown in FIG. 7, for the SC integrator 600, the beginning of the second time period/phase T2 substantially coincides with the beginning of the first time period/phase T1, and the end of the second time period/phase T2 substantially coincides with the end of the first time period/phase T1. Thus, the SC integrator 600 and the associated example timing diagram 700 are a particular case of the SC integrator 400 and the associated example timing diagram 500 where ps1=ps2=ps. The SC integrator 600 may be a more practical scheme and may have the added advantage of higher jitter tolerance. The SC integrator 600 and the associated example timing diagram 700 address the issue of the SC integrator 100 sampling the input $v_{in}$ on both falling edges of p1 and p2 by sampling the input $v_{in}$ on both sampling capacitors 111 and 112 using a single edge from a sampling clock ps (e.g., the edge at the time labeled "ts" in the timing diagram 700). This clock can be conveniently derived by an external master clock. Phases p1 and p2 are then used to transfer the accurately sampled charge from the sampling capacitors 111, 112 to the integrating capacitor 113. Jitter on the sampling (falling) edges of p1 and p2 is not critical, as the signals being sampled are settled, essentially constant in value, around those sampling edges.

It should be noted that, although the timing diagrams 500 and 700 illustrate the fourth time period T4 occurring before the third time period T3, in other embodiments of the SC integrators 400 and 600, this may be reversed, i.e., the third time period T3 may take place before the fourth time period T4, as long as other conditions described herein are satisfied (e.g., as long as the first time period T1 is finished before the third time period T3 starts and as long as the second time period T2 is finished before the fourth time period starts). Furthermore, although the timing diagram 500 illustrates that the second time period T2 ends before the first time period T1 ends, this may also be reversed in other embodiments of the SC integrator 400, as long as other conditions described herein are satisfied.

Example Dynamic Amplifier

In some embodiments, the amplifier 120 of any of the double-sampling SC integrators described herein may be a dynamic amplifier, configured to only draw power during the time periods T3 and T4. To that end, the amplifier 120 may be configured to be controlled by an amplifier switching arrangement that includes switches controlled with the control signals as those used to control the switching arrangements 440, 640, described above. One example of a dynamic amplifier for use as the amplifier 120 in double-sampling SC integrators with improved flicker noise rejection is shown in FIG. 8, providing an electric circuit diagram of a floating inverter dynamic amplifier 820 that may be used in double-sampling SC integrators with improved flicker noise rejection, e.g., in the SC integrator 400, according to some embodiments of the present disclosure.

Figure 8:
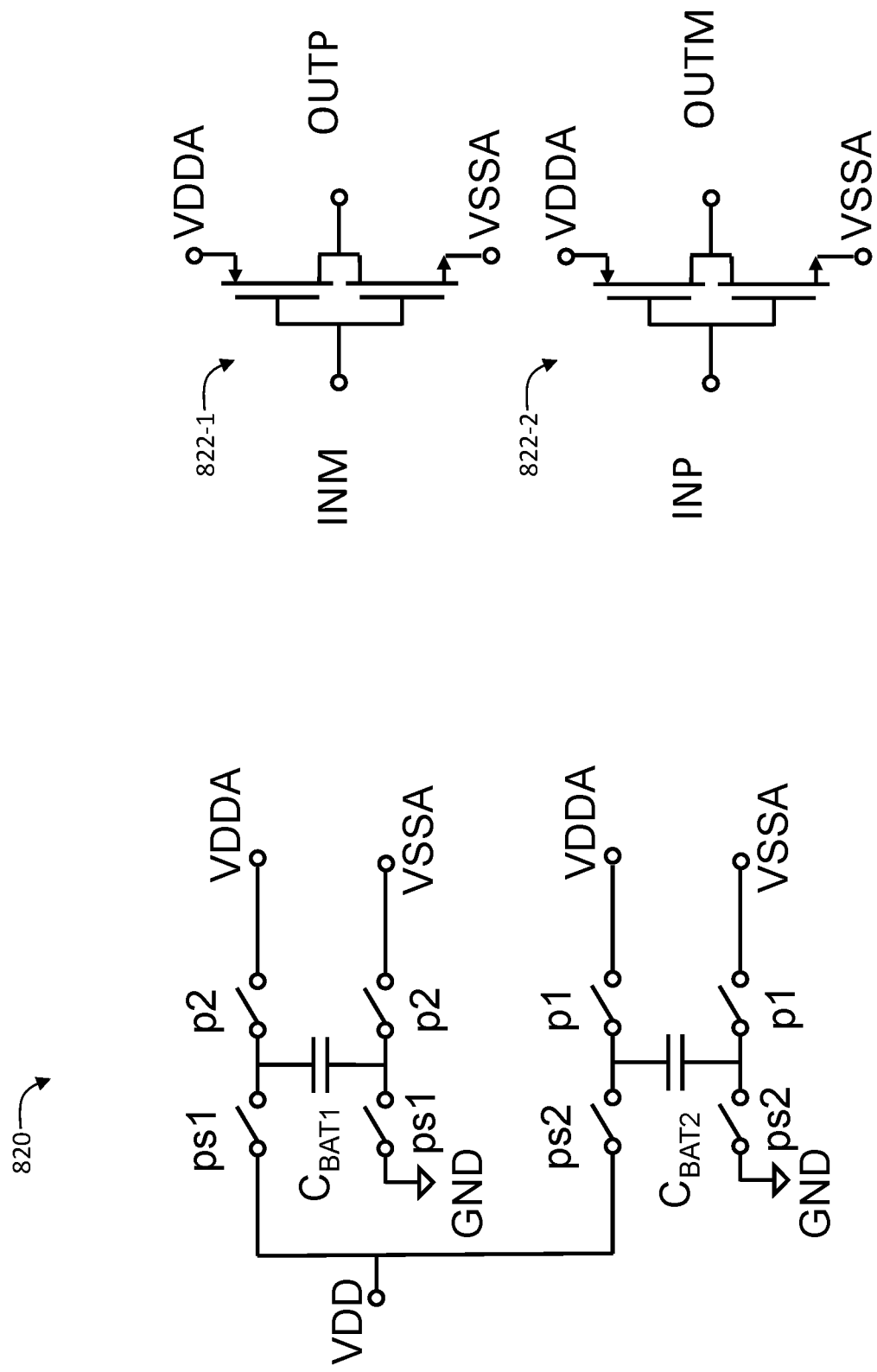
FIG. 8 provides an electric circuit diagram of a floating inverter dynamic amplifier that may be used in double-sampling SC integrators with improved flicker noise rejection, according to some embodiments of the present disclosure.

As shown in FIG. 8, the amplifier 820 includes a pair of complementary metal-oxide-semiconductor (CMOS) inverters 822-1, 822-2 and a pair of capacitors, $C_{BAT1}$ and $C_{BAT2}$. The capacitors $C_{BAT1}$ and $C_{BAT2}$ may be used to provide the supply to the CMOS inverters 822 in a dynamic manner by being controlled with control signals p1, p2, ps1, and ps2 of the SC integrator 400. When ps1 is high (i.e., the switch is in the first state), $C_{BAT1}$ may be charged to voltage supply VDD. When ps1 goes low (i.e., the switch is in the second state), $C_{BAT1}$ is disconnected from the supply voltage VDD and from the ground GND and then, when p2 is high, it is connected across the supply terminals VDDA and VSSA of the inverters 822-1 and 822-2. Hence, as p2 goes high, the inverters 822 initially experience a voltage supply of VDD, a bias current starts to flow in the P-type metal-oxide-semiconductor (PMOS) and N-type metal-oxide-semiconductor (NMOS) devices (e.g., PMOS and NMOS transistors, as shown in FIG. 8) and the CMOS inverters start to amplify their input signal. During the amplification phase, the integrating capacitor 113 may accumulate the third charge that is based on the first charge accumulated in the first sampling capacitor 111, as described above. As the time goes on, the input signal is further amplified and the bias current discharges the voltage across $C_{BAT1}$ until the PMOS and NMOS transistors turn off. This occurs when the voltage across $C_{BAT1}$ drops below the sum of the thresholds of the PMOS and NMOS transistors. Once the PMOS and NMOS transistors turn off, the transfer of charge from the sampling capacitor 111 to the integrating capacitor 113 stops. Similarly, $C_{BAT2}$ of the amplifier 820 is charged to VDD when ps2 is high and provides a supply current to the inverters 822 when p1 is high. When p1 is high, charge from the second sampling capacitor 112 is transferred to the integrating capacitor 113 and the charge transfer stops when the PMOS and NMOS transistors of the inverters 822 turn off. Such an arrangement provides an amplifier that may automatically shut off at the end of the charge transfer phases (i.e., at the end of the time periods T3 and T4, described herein). In some embodiments, the amplifier 820/120 may realize higher gain by cascading more inverters such as the inverters 822.

Example Electronic Device

SC integrators with improved flicker noise rejection according to various embodiments described herein may be implemented in a multitude of various electronic devices. One frequent, non-limiting, example of electronic devices in which such SC integrators may be implemented are ADCs.

Analog signals and/or values can be produced in various kinds of circuit elements, such as signal generators, sensors, and antennas. However, there can be many instances where having digital signals or values can be beneficial, such as for a processing or storing of the signals or values. To utilize the benefits of having a digital signal or value when an analog signal or value has been produced, ADCs have been developed to convert the analog signal or value into a digital signal or value.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

ADCs are electronic devices that convert a continuous physical quantity carried by an analog signal to a digital number that represents the quantity's amplitude (or to a digital signal carrying that digital number). The conversion involves quantization of the analog input signal, i.e., a process of mapping input values from a continuous set of analog values to output values in a countable smaller set of digital values, so it would introduce a small amount of error. Typically, the quantization occurs through periodic sampling of the analog input signal. The result is a sequence of digital values (i.e., a digital signal) that represents conversion of a continuous time and continuous-amplitude analog input signal to a discrete-time (DT) and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including noise spectral density (NSD), signal to noise ratio (SNR), signal-to-noise-and-distortion ratio (SNDR), effective number of bits (ENOB), total harmonic distortion (THD), total harmonic distortion plus noise (THD+N), and spurious free dynamic range (SFDR).

ADCs have many different designs, which can be chosen based on the application requirements and performance specifications. For example, DT delta-sigma ADCs based on SC loop filters is one such design.

Figure 9:
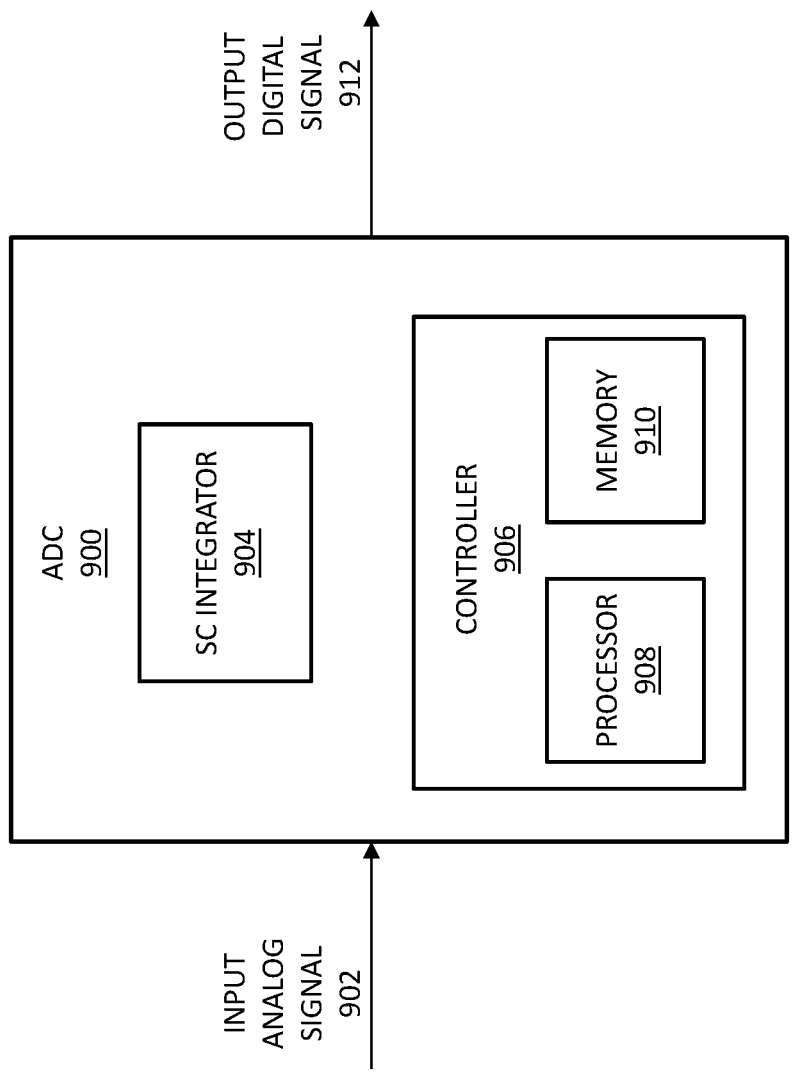
FIG. 9 provides a block diagram illustrating an ADC in which double-sampling SC integrators with improved flicker noise rejection may be implemented, according to some embodiments of the present disclosure.

FIG. 9 provides a block diagram illustrating an ADC 900 in which double-sampling SC integrators with improved flicker noise rejection may be implemented, according to some embodiments of the present disclosure. The ADC 900 may be any of the ADCs described above, e.g., a DT delta-sigma ADC.

As shown in FIG. 9, the ADC 900 is configured to receive input analog signal 902. At some point during the conversion performed by the ADC 900, an analog signal indicative of the input signal 902 may be provided as an input to a SC integrator 904. The SC integrator 904 may be any of the SC integrators with improved flicker noise rejection according to various embodiments described herein. An output of the SC integrator 904 may be used further in the process of the conversion performed by the ADC 900. For example, in a first order delta-sigma ADC, the output of the SC integrator 904 may be fed to a quantizer of the ADC 900 (not shown in FIG. 9). In delta-sigma ADCs with loop filter order higher than one, the output of the SC integrator 904 may be fed to additional filtering stages of the ADC 900 (not shown in FIG. 9).

The ADC 900 may further include a controller 906 configured to at least generate the control signals in the manner described above to operate the SC integrator 904 in accordance with the techniques described herein. To that end, in some embodiments, the controller 906 may include at least a processor 908 and a memory 910, as shown in FIG. 9, configured to control operation of double-sampling SC integrators with improved flicker noise rejection as described herein. For example, the controller 906 may control timing and generation of the control signals p1, p2, ps1, ps2, and ch, as described herein.

Digital signal/values 912 may then be provided at the output of the ADC 900, the output digital signal 912 corresponding to the input analog signal 902. The digital signal 912 may be a time-based sequence of values. A digital value may be represented by a code. A name of a code (for example, CODE1) may refer to a digital value represented by the code. Some (but not all) digital values may be represented by codes using binary-weighted encoding. A resolution of a digital value or code expressed in terms of a number of bits may refer to a binary-weighted encoding, regardless of how it may be encoded.

While FIG. 9 illustrates the controller 906 to be included within the ADC 900, in other embodiments, the controller 906 may be implemented external to the ADC 900, in which case the controller 906 may be configured to control the ADC 900 remotely, via any appropriate communication channel. In other words, instead of being implemented within the ADC 900 as shown in FIG. 9, the controller 906 may be external to the ADC 900 and be communicatively coupled to the ADC 900.

Example Data Processing System

Figure 10:
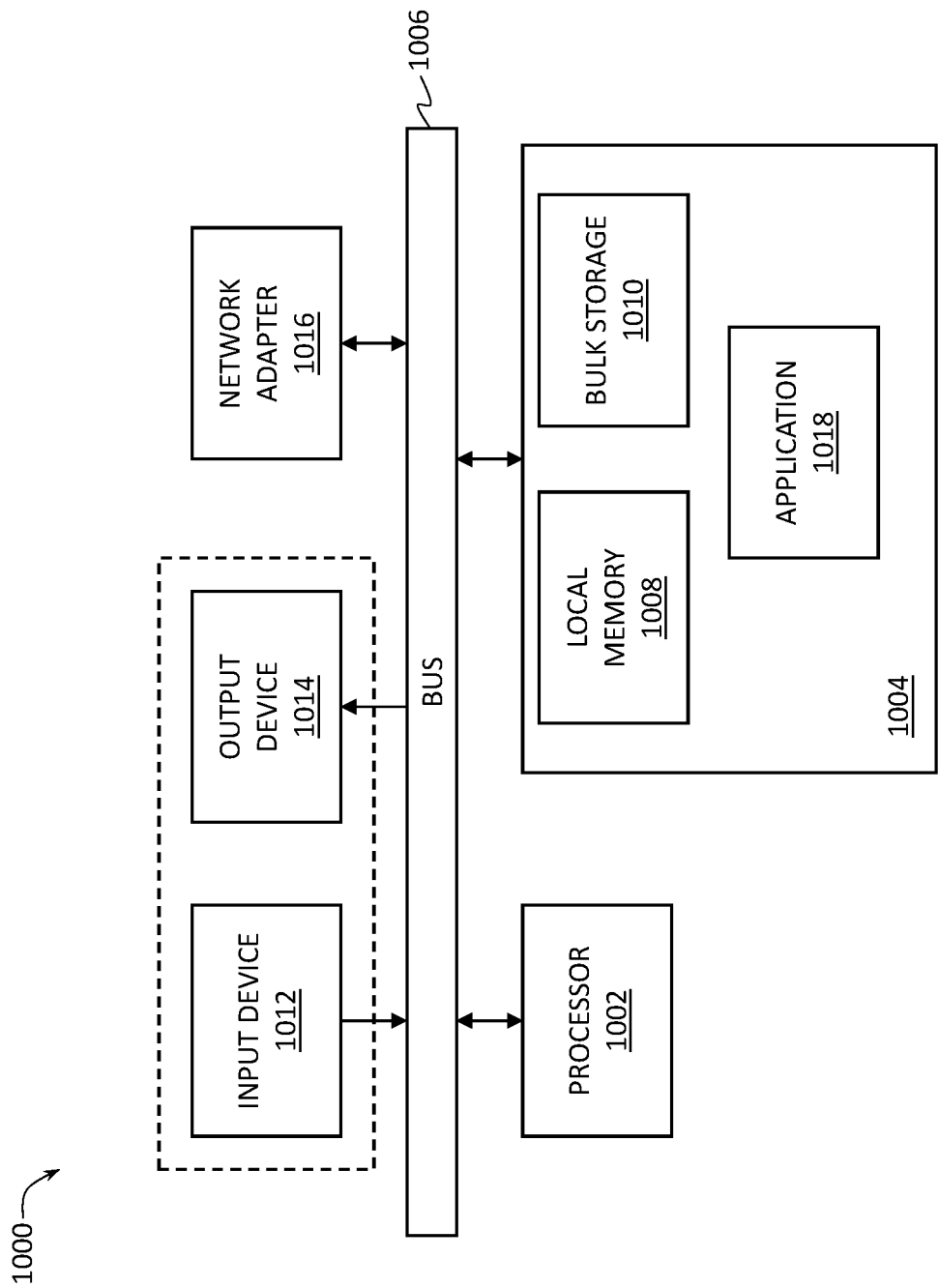
FIG. 10 provides a block diagram illustrating an example data processing system that may be configured to implement, or control, at least portions of operating double-sampling SC integrators with improved flicker noise rejection, according to some embodiments of the present disclosure.

FIG. 10 provides a block diagram illustrating an example data processing system that may be configured to implement, or control, at least portions of operating double-sampling SC integrators with improved flicker noise rejection, according to some embodiments of the present disclosure. For example, the data processing system 1000 may be configured to implement or control portions of the controller 906 of the ADC 900 shown in FIG. 9. In general, the data processing system 1000 may be configured to implement or control portions of the SC integrators with improved flicker noise rejection as described with reference to FIGS. 3-8, or any further embodiments of electronic devices that may include such SC integrators.

As shown in FIG. 10, the data processing system 1000 may include at least one processor 1002, e.g., a hardware processor 1002, coupled to memory elements 1004 through a system bus 1006. As such, the data processing system may store program code within memory elements 1004. Further, the processor 1002 may execute the program code accessed from the memory elements 1004 via a system bus 1006. In one aspect, the data processing system may be implemented as a computer that is suitable for storing and/or executing program code. It should be appreciated, however, that the data processing system 1000 may be implemented in the form of any system including a processor and a memory that is capable of performing the functions described within this disclosure.

In some embodiments, the processor 1002 can execute software or an algorithm to perform the activities as discussed in the present disclosure, in particular activities related to implementing double-sampling SC integrators with improved flicker noise rejection as described herein. The processor 1002 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 1002 may be communicatively coupled to the memory element 1004, for example in a direct-memory access (DMA) configuration, so that the processor 1002 may read from or write to the memory elements 1004.

In general, the memory elements 1004 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 1000 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating double-sampling SC integrators with improved flicker noise rejection or larger electronic devices with such SC integrators as shown in FIGS. 1-9, can also include suitable interfaces for receiving, transmitting, and/or otherwise communicating data or information in a network environment so that they can communicate with, e.g., the data processing system 1000.

In certain example implementations, mechanisms for implementing double-sampling SC integrators with improved flicker noise rejection as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as the memory elements 1004 shown in FIG. 10, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as the processor 1002 shown in FIG. 10, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1004 may include one or more physical memory devices such as, for example, local memory 1008 and one or more bulk storage devices 1010. The local memory may refer to RAM or other non-persistent memory device(s) generally used during actual execution of the program code. A bulk storage device may be implemented as a hard drive or other persistent data storage device. The processing system 1000 may also include one or more cache memories (not shown) that provide temporary storage of at least some program code in order to reduce the number of times program code must be retrieved from the bulk storage device 1010 during execution.

As shown in FIG. 10, the memory elements 1004 may store an application 1018. In various embodiments, the application 1018 may be stored in the local memory 1008, the one or more bulk storage devices 1010, or apart from the local memory and the bulk storage devices. It should be appreciated that the data processing system 1000 may further execute an operating system (not shown in FIG. 10) that can facilitate execution of the application 1018. The application 1018, being implemented in the form of executable program code, can be executed by the data processing system 1000, e.g., by the processor 1002. Responsive to executing the application, the data processing system 1000 may be configured to perform one or more operations or method steps described herein.

Input/output (I/O) devices depicted as an input device 1012 and an output device 1014, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 1014 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 1014. Input and/or output devices 1012, 1014 may be coupled to the data processing system either directly or through intervening I/O controllers.

In an embodiment, the input and the output devices may be implemented as a combined input/output device (illustrated in FIG. 10 with a dashed line surrounding the input device 1012 and the output device 1014). An example of such a combined device is a touch sensitive display, also sometimes referred to as a "touch screen display" or simply "touch screen". In such an embodiment, input to the device may be provided by a movement of a physical object, such as a stylus or a finger of a user, on or near the touch screen display.

A network adapter 1016 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 1000, and a data transmitter for transmitting data from the data processing system 1000 to said systems, devices and/or networks. Modems, cable modems, and Ethernet cards are examples of different types of network adapter that may be used with the data processing system 1000.

SELECT EXAMPLES

The following paragraphs provide various select examples of the embodiments disclosed herein.

Example 1 provides an electronic device, configured to receive an input signal at an input and to generate an output signal at an output. The electronic device includes a first capacitor; a second capacitor; an amplifier, having a positive input port and a negative input port; a third capacitor, coupled to an output of the amplifier (e.g., in some embodiments, having a first capacitor electrode coupled to the input of the amplifier and having a second capacitor electrode coupled to the output of the amplifier, and in other embodiments, still having the second capacitor electrode coupled to the output of the amplifier, but having the first capacitor electrode coupled to a bias voltage); and a switching arrangement. The switching arrangement is configured to 1) configure the first capacitor to accumulate a first charge during a first time period (T1, e.g., the time period when one or more switches ps1 are closed), the first charge being indicative of the input signal, 2) configure the second capacitor to accumulate a second charge during a second time period (T2, e.g., the time period when one or more switches ps2 are closed), the second charge being indicative of the input signal, 3) configure the third capacitor to integrate a third charge during a third time period (T3, e.g., the time period when one or more switches p2 are closed) by coupling the first capacitor to one of the positive input port and the negative input port of the amplifier, where the third charge is indicative of the first charge (i.e., by configuring the first capacitor to at least partially discharge in a manner so the third capacitor accumulates a third charge that is indicative of the first charge sampled by the first capacitor), where the third time period does not overlap with the first time period (but may overlap with the second time period), and 4) configure the third capacitor to integrate a fourth charge during a fourth time period (T4, e.g., the time period when one or more switches p1 are closed) by coupling the second capacitor to another one of the positive input port and the negative input port of the amplifier, where the fourth charge is indicative of the second charge (i.e., by configuring the second capacitor to at least partially discharge in a manner so the third capacitor accumulates a fourth charge that is indicative of the second charge sampled by the second capacitor), where the fourth time period does not overlap with the second time period and does not overlap with the third time period, where the third capacitor is configured to accumulate the fourth charge in addition to the third charge or vice versa, and where the output signal is based on a sum of the third charge and the fourth charge accumulated by the third capacitor.

Example 2 provides the electronic device according to example 1, where at least one is true a beginning of the third time period does not coincide with a beginning of the second time period, an end of the third time period does not coincide with an end of the second time period, a beginning of the fourth time period does not coincide with a beginning of the first time period, and an end of the fourth time period does not coincide with an end of the first time period.

Example 3 provides the electronic device according to any one of the preceding examples, where the first time period at least partially overlaps with the second time period.

Example 4 provides the electronic device according to any one of the preceding examples, where the first time period overlaps with the second time period so that a beginning of the second time period substantially coincides with a beginning of the first time period, and an end of the second time period substantially coincides with an end of the first time period.

Example 5 provides the electronic device according to any one of the preceding examples, where: 1) during the first time period, the switching arrangement ensures that the first capacitor is coupled to the input signal and de-coupled from the positive input port and the negative input port of the amplifier, 2) during the second time period, the switching arrangement ensures that the second capacitor is coupled to the input signal and de-coupled from the positive input port and the negative input port of the amplifier, 3) during the third time period, the switching arrangement ensures that the first capacitor is de-coupled to the input signal, and 4) during the fourth time period, the switching arrangement ensures that the second capacitor is de-coupled to the input signal.

Example 6 provides the electronic device according to any one of the preceding examples, where the third time period does not overlap with the fourth time period.

Example 7 provides the electronic device according to example 1, where a time difference between an end of the third time period and an end of the fourth time period is less than half of a period of a master clock configured to time operation of at least portions of the electronic device.

Example 8 provides a SC integrator that includes a charging circuit, including an input, coupled to an input signal, and further including an output, a plurality of switches, a first capacitor, and a second capacitor; an amplifier, having a differential input and a differential output; an integrating capacitor, coupled to the differential output of the amplifier; and a chopper circuit, configured to be either in a first state or in a second state, where, in the first state, the chopper circuit couples the output of the charging circuit to a positive input of the differential input of the amplifier and couples a negative output of the differential output of the amplifier to the integrating capacitor, and, in the second state, the chopper circuit couples the output of the charging circuit to a negative input of the differential input of the amplifier and couples a positive output of the differential output of the amplifier to the integrating capacitor. In such a SC integrator, the plurality of switches is configured to couple the first capacitor to the input of the charging circuit (thus coupling it to the input signal) and de-couple the first capacitor from the output of the charging circuit during a first phase (T1, e.g., the time period when one or more switches ps1 are closed) to enable the first capacitor to accumulate a first charge indicative of the input signal sampled on the first capacitor during the first phase, couple the second capacitor to the input of the charging circuit (thus coupling it to the input signal) and de-couple the second capacitor from the output of the charging circuit during a second phase (T2, e.g., the time period when one or more switches ps2 are closed) to enable the second capacitor to accumulate a second charge indicative of the input signal sampled on the second capacitor during the second phase, where the second phase at least partially overlaps (in time) with the first phase, couple the first capacitor to the output of the charging circuit (thus coupling it to either positive or negative input of the amplifier, depending on the state of the chopper circuit) and de-couple the first capacitor from the input of the charging circuit during a third phase (T3, e.g., the time period when one or more switches p2 are closed), where the third phase starts after the first charge has been accumulated in the first capacitor and where the chopper circuit is in the first state at an end of the third phase, and couple the second capacitor to the output of the charging circuit (thus coupling it to either positive or negative input of the amplifier, depending on the state of the chopper circuit) and de-couple the second capacitor from the input of the charging circuit during a fourth phase (T4, e.g., the time period when one or more switches p1 are closed), where the fourth phase starts after the second charge has been accumulated in the second capacitor and where the chopper circuit is in the second state at an end of the fourth phase.

Example 9 provides the SC integrator according to example 8, where, during the third phase, a third charge is accumulated in the integrating capacitor, the third charge being indicative of the first charge, and, during the fourth phase, a fourth charge is accumulated in the integrating capacitor, the fourth charge being indicative of the second charge.

Example 10 provides the SC integrator according to examples 8 or 9, where, if the third phase takes place before the fourth phase, then the plurality of switches is configured to couple the integrating capacitor to an output of the SC integrator during the fourth phase, and, if the fourth phase takes place before the third phase, then the plurality of switches is configured to couple the integrating capacitor to an output of the SC integrator during the third phase.

Example 11 provides the SC integrator according to any one of examples 8-10, where, if the third phase takes place before the fourth phase, then a time difference between an end of the third phase and an end of the fourth phase is less than half of a clock cycle of a master clock, and, if the fourth phase takes place before the third phase, then a time difference between an end of the fourth phase and an end of the third phase is less than half of a clock cycle of a master clock.

Example 12 provides the SC integrator according to any one of examples 8-11, where the first phase substantially coincides with the second phase so that a beginning of the second phase substantially coincides with a beginning of the first phase, and an end of the second phase substantially coincides with an end of the first phase.

Example 13 provides the SC integrator according to any one of examples 8-12, where, if the third phase takes place before the fourth phase, the chopper circuit switches from being in the first state to being in the second state after an end of the third phase and between a beginning of the fourth phase.

Example 14 provides the SC integrator according to any one of examples 8-13, where the chopper circuit is in the first state during an entire duration of the third phase.

Example 15 provides the SC integrator according to any one of examples 8-14, where, if the fourth phase takes place before the third phase, the chopper circuit switches from being in the second state to being in the first state after an end of the fourth phase and between a beginning of the third phase.

Example 16 provides the SC integrator according to any one of examples 8-15, where the chopper circuit is in the second state during an entire duration of the fourth phase.

Example 17 provides the SC integrator according to any one of examples 8-12 and 16, where the chopper circuit switches from being in the second state to being in the first state during the third phase.

Example 18 provides the SC integrator according to any one of examples 8-12 and 14, where the chopper circuit switches from being in the first state to being in the second state during the fourth phase.

Example 19 provides a SC integrator that includes a first capacitor; a second capacitor; an amplifier; a third capacitor, coupled to an output of the amplifier; and a switching arrangement, configured to, during a time period of a single cycle of a master clock: 1) enable the first capacitor to accumulate a first charge, indicative of a sample of an input signal accumulated during a first time period, 2) enable the second capacitor to accumulate a second charge, indicative of a sample of the input signal accumulated during a second time period, and 3) enable the third capacitor to, in a third time period, integrate a charge indicative of at least a portion of the sample of the input signal accumulated during the first time period and a sample of a flicker noise of the amplifier at an end of the third time period, and, in a fourth time period, integrate a charge indicative of at least a portion of the sample of the input signal accumulated during the second time period and an inverted version of a flicker noise of the amplifier at an end of the fourth time period, where a time difference between an end of the third time period and an end of the fourth time period is independent of a clock cycle of the master clock.

Example 20 provides the SC integrator according to example 19, where the time difference between the end of the third time period and the end of the fourth time period is less than half of the clock cycle of the master clock.

The SC integrator according to any one of the preceding examples is able to reject the flicker noise of its amplifier very well, even when operated at slow frequencies/long master clock periods, by adding (integrating in the capacitor 113) sign-inverted (chopped) samples of the amplifier flicker noise at every clock cycle and by keeping the time distance/delay between those to samples small, regardless of the clock frequency.

Other Implementation Notes, Variations, and Applications

The described double-sampling SC integrators with improved flicker noise rejection may be particularly suitable for various types of ADCs, such as high-speed and/or high-precision ADCs. While embodiments of the present disclosure were described above with references to exemplary implementations as shown in FIGS. 3-10, a person skilled in the art will realize that the various teachings described above are applicable to a large variety of other implementations. For example, some applications which can greatly benefit from implementing double-sampling SC integrators with improved flicker noise rejection as described herein include instrumentation, testing, spectral analyzers, military purposes, radar, wired or wireless communications, mobile telephones (especially because standards continue to push for higher speed communications), and base stations.

In the discussions of the embodiments above, components of a system, such as capacitors, switches, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to providing double-sampling SC integrators with improved flicker noise rejection as described herein.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on a chip (SOC) package, either in part, or in whole. An SOC represents an IC that integrates components of a computer or other electronic system into a single chip. It may contain digital, analog, mixed-signal, and often radio frequency (RF) functions, all of which may be provided on a single chip or a single substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 1-10) have only been offered for purposes of example and teaching only. Such information may be varied considerably without departing from the spirit of the present disclosure. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular component arrangements. Various modifications and changes may be made to such embodiments without departing from the scope of the present disclosure. The description and drawings are, accordingly, to be regarded in an illustrative rather than in a restrictive sense.

The invention claimed is:

1. An electronic device, configured to receive an input signal at an input and to generate an output signal at an output, the electronic device comprising:
a first capacitor;
a second capacitor;
an amplifier, having a positive input port and a negative input port;
a third capacitor, coupled to an output of the amplifier; and
a switching arrangement, configured to:
configure the first capacitor to accumulate a first charge during a first time period, the first charge being indicative of the input signal,
configure the second capacitor to accumulate a second charge during a second time period, the second charge being indicative of the input signal,
configure the third capacitor to integrate a third charge during a third time period by coupling the first capacitor to one of the positive input port and the negative input port of the amplifier, where the third charge is indicative of the first charge, where the third time period does not overlap with the first time period, and
configure the third capacitor to integrate a fourth charge during a fourth time period by coupling the second capacitor to another one of the positive input port and the negative input port of the amplifier, where the fourth charge is indicative of the second charge, where the fourth time period does not overlap with the second time period and does not overlap with the third time period,
wherein the third capacitor is configured to accumulate the fourth charge in addition to the third charge or vice versa, and wherein the output signal is based on a sum of the third charge and the fourth charge accumulated by the third capacitor;
wherein a time difference between an end of the third time period and an end of the fourth time period is less than half of a period of a master clock configured to time operation of at least portions of the electronic device.

2. The electronic device according to claim 1, wherein at least one is true:
a beginning of the third time period does not coincide with a beginning of the second time period,
the end of the third time period does not coincide with an end of the second time period, a beginning of the fourth time period does not coincide with a beginning of the first time period, and
the end of the fourth time period does not coincide with an end of the first time period.

3. The electronic device according to claim 1, wherein the first time period at least partially overlaps with the second time period.

4. The electronic device according to claim 1, wherein the first time period overlaps with the second time period so that:
a beginning of the second time period substantially coincides with a beginning of the first time period, and
an end of the second time period substantially coincides with an end of the first time period.

5. The electronic device according to claim 1, wherein:
during the first time period, the first capacitor is coupled to the input signal and decoupled from the positive input port and the negative input port of the amplifier,
during the second time period, the second capacitor is coupled to the input signal and de-coupled from the positive input port and the negative input port of the amplifier,
during the third time period, the first capacitor is de-coupled to the input signal, and
during the fourth time period, the second capacitor is de-coupled to the input signal.

6. The electronic device according to claim 1, wherein the fourth time period does not overlap with the first time period.

7. The electronic device according to claim 1, wherein a time difference between an end of the first time period and an end of the second time period is less than half of the period of the master clock.

8. A switched-capacitor (SC) integrator, comprising:
a charging circuit, comprising an input, coupled to an input signal, and further comprising an output, a plurality of switches, a first capacitor, and a second capacitor;
an amplifier, having a differential input and a differential output;
an integrating capacitor; and
a chopper circuit, configured to be either in a first state or in a second state, where:
in the first state, the chopper circuit couples the output of the charging circuit to a positive input of the differential input of the amplifier and couples a negative output of the differential output of the amplifier to the integrating capacitor, and
in the second state, the chopper circuit couples the output of the charging circuit to a negative input of the differential input of the amplifier and couples a positive output of the differential output of the amplifier to the integrating capacitor, wherein the plurality of switches is configured to:
couple the first capacitor to the input and de-couple the first capacitor from the output of the charging circuit during a first phase to enable the first capacitor to accumulate a first charge indicative of the input signal sampled on the first capacitor during the first phase,
couple the second capacitor to the input and de-couple the second capacitor from the output of the charging circuit during a second phase to enable the second capacitor to accumulate a second charge indicative of the input signal sampled on the second capacitor during the second phase, where the second phase at least partially overlaps with the first phase,
couple the first capacitor to the output of the charging circuit and de-couple the first capacitor from the input during a third phase, where the third phase starts after the first charge has been accumulated in the first capacitor and where the chopper circuit is in the first state at an end of the third phase, and
couple the second capacitor to the output of the charging circuit and de-couple the second capacitor from the input during a fourth phase, where the fourth phase starts after the second charge has been accumulated in the second capacitor and where the chopper circuit is in the second state at an end of the fourth phase.

9. The SC integrator according to claim 8, wherein:
during the third phase, a third charge is accumulated in the integrating capacitor, the third charge being indicative of the first charge, and
during the fourth phase, a fourth charge is accumulated in the integrating capacitor, the fourth charge being indicative of the second charge.

10. The SC integrator according to claim 8, wherein:
if the third phase takes place before the fourth phase, then the plurality of switches is configured to couple the integrating capacitor to an output of the SC integrator during the fourth phase, and
if the fourth phase takes place before the third phase, then the plurality of switches is configured to couple the integrating capacitor to the output of the SC integrator during the third phase.

11. The SC integrator according to claim 8, wherein:
if the third phase takes place before the fourth phase, then a time difference between the end of the third phase and the end of the fourth phase is less than half of a clock cycle of a master clock, and
if the fourth phase takes place before the third phase, then a time difference between the end of the fourth phase and the end of the third phase is less than half of a clock cycle of the master clock.

12. The SC integrator according to claim 8, wherein the first phase substantially coincides with the second phase so that:
a beginning of the second phase substantially coincides with a beginning of the first phase, and
an end of the second phase substantially coincides with an end of the first phase.

13. The SC integrator according to claim 8, wherein, if the third phase takes place before the fourth phase, the chopper circuit switches from being in the first state to being in the second state after the end of the third phase and between a beginning of the fourth phase.

14. The SC integrator according to claim 8, wherein the chopper circuit is in the first state during an entire duration of the third phase.

15. The SC integrator according to claim 8, wherein, if the fourth phase takes place before the third phase, the chopper circuit switches from being in the second state to being in the first state after the end of the fourth phase and between a beginning of the third phase.

16. The SC integrator according to claim 8, wherein the chopper circuit is in the second state during an entire duration of the fourth phase.

17. The SC integrator according to claim 8, wherein the chopper circuit switches from being in the second state to being in the first state during the third phase.

18. The SC integrator according to claim 8, wherein the chopper circuit switches from being in the first state to being in the second state during the fourth phase.

19. A switched-capacitor (SC) integrator, comprising:
a first capacitor;
a second capacitor;
an amplifier;
a third capacitor, coupled to an output of the amplifier; and
a switching arrangement, configured to, during a time period of a single cycle of a master clock:
enable the first capacitor to accumulate a first charge, indicative of a sample of an input signal accumulated during a first time period,
enable the second capacitor to accumulate a second charge, indicative of a sample of the input signal accumulated during a second time period, and
enable the third capacitor to:
in a third time period, integrate a charge indicative of at least a portion of the sample of the input signal accumulated during the first time period and a sample of a flicker noise at an end of the third time period, and
in a fourth time period, integrate a charge indicative of at least a portion of the sample of the input signal accumulated during the second time period and an inverted version of the flicker noise at an end of the fourth time period,
wherein a time difference between the end of the third time period and the end of the fourth time period is independent of a clock cycle of the master clock.

20. The SC integrator according to claim 19, wherein the time difference between the end of the third time period and the end of the fourth time period is less than half of the clock cycle of the master clock.

* * * * *